(12) United States Patent
Yu

(10) Patent No.: US 12,500,215 B2
(45) Date of Patent: Dec. 16, 2025

(54) DISPLAY PANEL AND DISPLAY DEVICE

(71) Applicant: Shanghai Tianma Micro-Electronics Co., Ltd., Shanghai (CN)

(72) Inventor: Quanpeng Yu, Shanghai (CN)

(73) Assignee: Shanghai Tianma Micro-Electronics Co., Ltd., Shanghai (CN)

( * ) Notice: Subject to any disclaimer, the term of this patent is extended or adjusted under 35 U.S.C. 154(b) by 997 days.

(21) Appl. No.: 17/585,469

(22) Filed: Jan. 26, 2022

(65) Prior Publication Data

US 2022/0149026 A1 May 12, 2022

(30) Foreign Application Priority Data

Sep. 30, 2021 (CN) .......................... 202111166257.0

(51) Int. Cl.
*H01L 25/16* (2023.01)
*H10D 86/40* (2025.01)
*H10D 86/60* (2025.01)

(52) U.S. Cl.
CPC ........... *H01L 25/167* (2013.01); *H10D 86/40* (2025.01); *H10D 86/60* (2025.01)

(58) Field of Classification Search
CPC .............. H01L 25/167; H01L 25/0753; H10H 20/8513; H10H 20/855; H10H 20/8514; H10D 86/60; H10D 86/40
See application file for complete search history.

(56) References Cited

U.S. PATENT DOCUMENTS 9,448,448 B2\* 9/2016 Tomioka ........... G02F 1/133512
11,360,592 B2\* 6/2022 Cao ...................... G06F 3/0412
11,374,028 B2\* 6/2022 Miyairi .............. H10D 30/6739
11,935,902 B2\* 3/2024 Wang ................... H10D 86/411
2019/0156097 A1 5/2019 Liu et al.
2020/0312831 A1 10/2020 He et al.
2020/0343320 A1 10/2020 Zeng et al.
2021/0336103 A1\* 10/2021 Chen .................... H10H 29/142
(Continued)

FOREIGN PATENT DOCUMENTS

CN 106298859 A 1/2017
CN 208622728 U 3/2019
(Continued)

OTHER PUBLICATIONS

Office Action of CN Patent Application No. 202111166257.0 dated Apr. 7, 2025.

*Primary Examiner* — Vinh T Lam
(74) *Attorney, Agent, or Firm* — KILPATRICK TOWNSEND & STOCKTON LLP

(57) ABSTRACT

A display panel and a display device are provided. In the first pixel unit region, an orthographic projection of the first light-shielding portion on the base covers an orthographic projection of at least one via hole on the base. Thus, the first light-shielding portion can shield the light which is emitted by the adjacent light-emitting element and reflected by the via hole. In addition, the first light-shielding portion can further shield the light which is emitted by the light-emitting element in the first pixel unit region to the via hole, to avoid reflecting the light to the adjacent pixel unit region by the via hole in the first pixel unit region. Therefore, the light crosstalk between adjacent light-emitting elements is reduced, and the display effect of the display device is improved.

20 Claims, 23 Drawing Sheets

(56) References Cited

U.S. PATENT DOCUMENTS

2021/0359176 A1* 11/2021 Chen .................. H10F 55/10
2024/0260431 A1    8/2024 Hou et al.

FOREIGN PATENT DOCUMENTS

| CN | 109859647 A | 6/2019 |
| CN | 113241417 A | 8/2021 |
| CN | 113285044 A | 8/2021 |

* cited by examiner

DISPLAY PANEL AND DISPLAY DEVICE

This application claims the priority to Chinese Patent Application No. 202111166257.0, titled "DISPLAY PANEL AND DISPLAY DEVICE", filed on Sep. 30, 2021 with the China National Intellectual Property Administration, the disclosure of which is hereby incorporated by reference in its entirety.

FIELD

The present disclosure relates to the field of display technology, and more particularly, to a display panel and a display device.

BACKGROUND

Micro light-emitting diode (Micro-LED) display panels have received more and more attention due to their advantages of high display brightness, high luminous efficiency, and low power consumption. However, in the existing display panel, a crosstalk occurs in light emitted by adjacent micro light-emitting diodes, which affects the display effect of the display device.

SUMMARY

In view of this, a display panel and a display device are provided according to the present disclosure, which can effectively solve the problems in the existing technology, reduce the light crosstalk between adjacent light-emitting elements, and ensure a good display effect of the display device.

In order to achieve the above objectives, solutions provided by the present disclosure are as follows.

A display panel includes a first substrate, and a second substrate opposite to the first substrate, and the display panel includes multiple pixel unit regions.

In at least one pixel unit region of the multiple pixel unit regions, the second substrate includes a base, a light-emitting element located on a side of the base facing the first substrate, and a driving circuit layer between the light-emitting element and the base. The light-emitting element is used to generate first color light. The multiple pixel unit regions include a first pixel unit region for generating the first color light. The driving circuit layer includes multiple via holes.

In the first pixel unit region, the display panel includes at least one first light-shielding portion at a side of the via hole away from the base. A first light-shielding orthographic projection of the first light-shielding portion on the base covers a via hole orthographic projection of at least one via hole on the base.

A display device is further provided according to the present disclosure. The display device includes the above-mentioned display panel.

Compared with the existing technology, the embodiments provided by the present disclosure have at least the following advantages.

A display panel and a display device are provided according to the present disclosure. The display panel includes a first substrate, and a second substrate opposite to the first substrate.

The display panel includes multiple pixel unit regions. In each of the multiple pixel unit regions, the second substrate includes a base, a light-emitting element located on a side of the base facing the first substrate, and a driving circuit layer located between the light-emitting element and the base. The light-emitting element is configured to generate first color light. The multiple pixel unit regions include a first pixel unit region configured to generate the first color light. The driving circuit layer includes multiple via holes. In the first pixel unit region, the display panel includes at least one first light-shielding portion located on a side of the multiple via holes away from the base. A first light-shielding orthographic projection of the first light-shielding portion on the base covers a via hole orthographic projection of at least one via hole on the base.

BRIEF DESCRIPTION OF THE DRAWINGS

In order to more clearly explain the embodiments of the present disclosure, the drawings used in the description of the embodiments will be briefly introduced below. The drawings in the following description are merely some embodiments of the present disclosure.

DETAILED DESCRIPTION

The embodiments of the present disclosure will be clearly and completely described below in conjunction with the accompanying drawings in the embodiments of the present disclosure. The described embodiments are only a part of embodiments of the present disclosure, rather than all embodiments.

As described in the background, a micro light-emitting diode display panel includes multiple micro light-emitting diodes fixed on a substrate. The substrate includes a driving circuit layer for providing driving signals to the micro light-emitting diodes, and the driving circuit layer includes multiple via holes. In order to avoid the crosstalk between light beams emitted by adjacent micro light-emitting diodes, a barrier layer surrounding the micro light-emitting diode is usually provided. However, because the via hole can reflect light, the light emitted by one micro light-emitting diode can usually be reflected through the via hole to an area where an adjacent micro light-emitting diode is located. Thus, crosstalk occurs in light emitted by the adjacent the pixel units, which deteriorates the display effect of the display device.

Based on this, a display panel and a display device are provided according to embodiments of the present disclosure, which effectively solve the problems in the existing technology, reduce the light crosstalk between adjacent light-emitting elements, and ensure a good display effect of the display device.

In order to achieve the foregoing objectives, the embodiments of the present disclosure are as follows. The embodiments of the present disclosure will be described in detail with reference to FIGS. 1 to 24.

Figure 1:
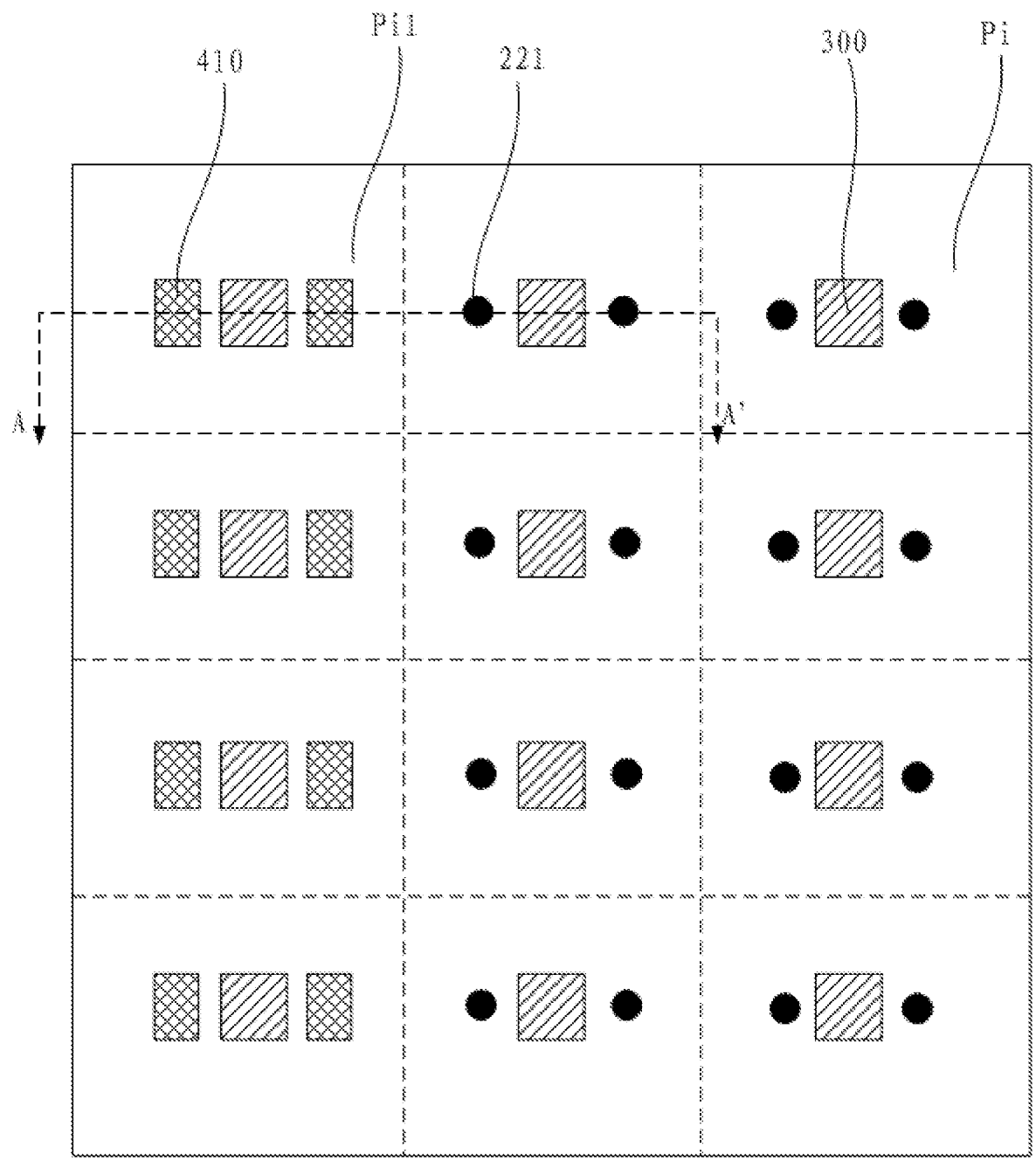
FIG. 1 is a schematic structural diagram of a display panel according to an embodiment of the present disclosure.
Figure 2:
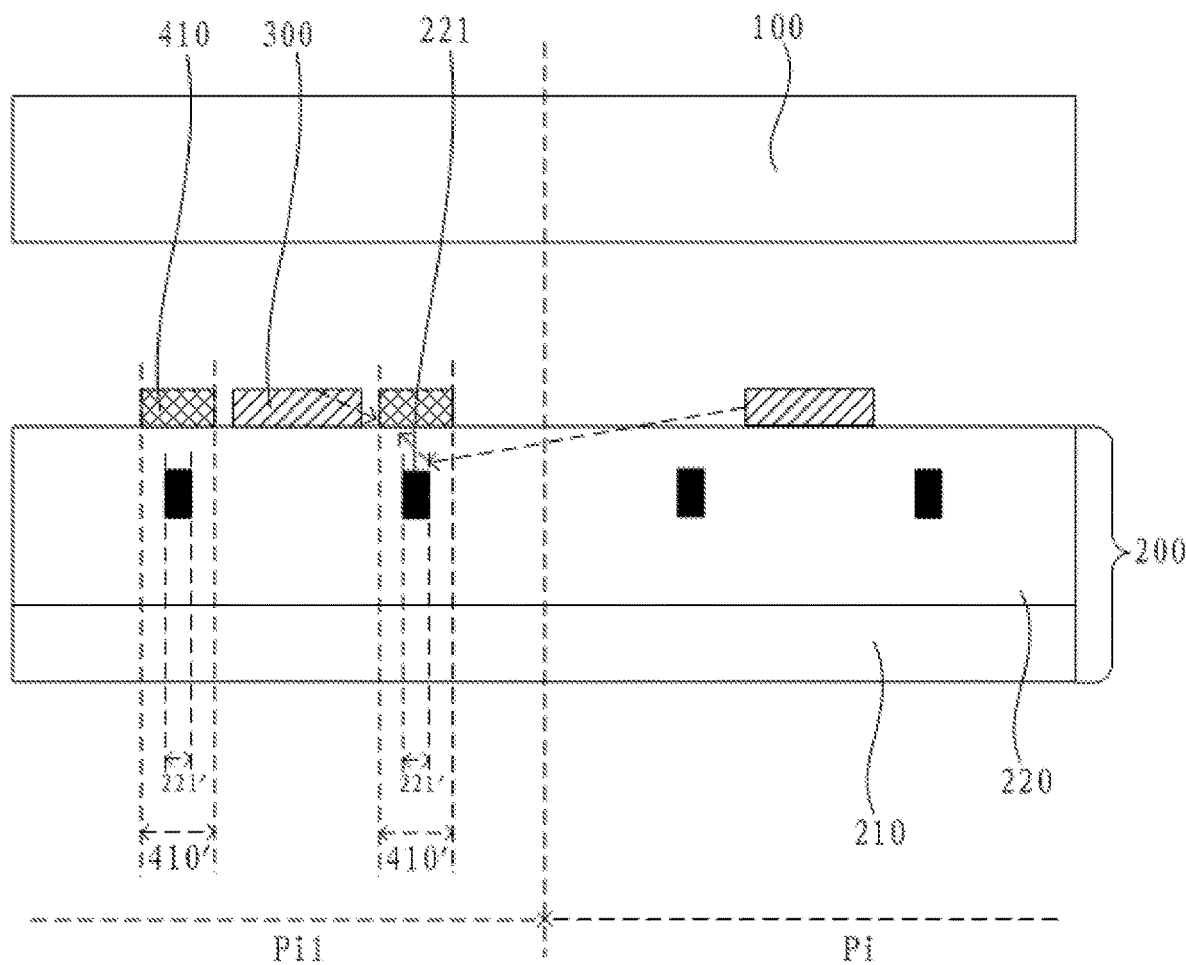
FIG. 2 is a section diagram of FIG. 1 in an AA' direction.
Figure 3:
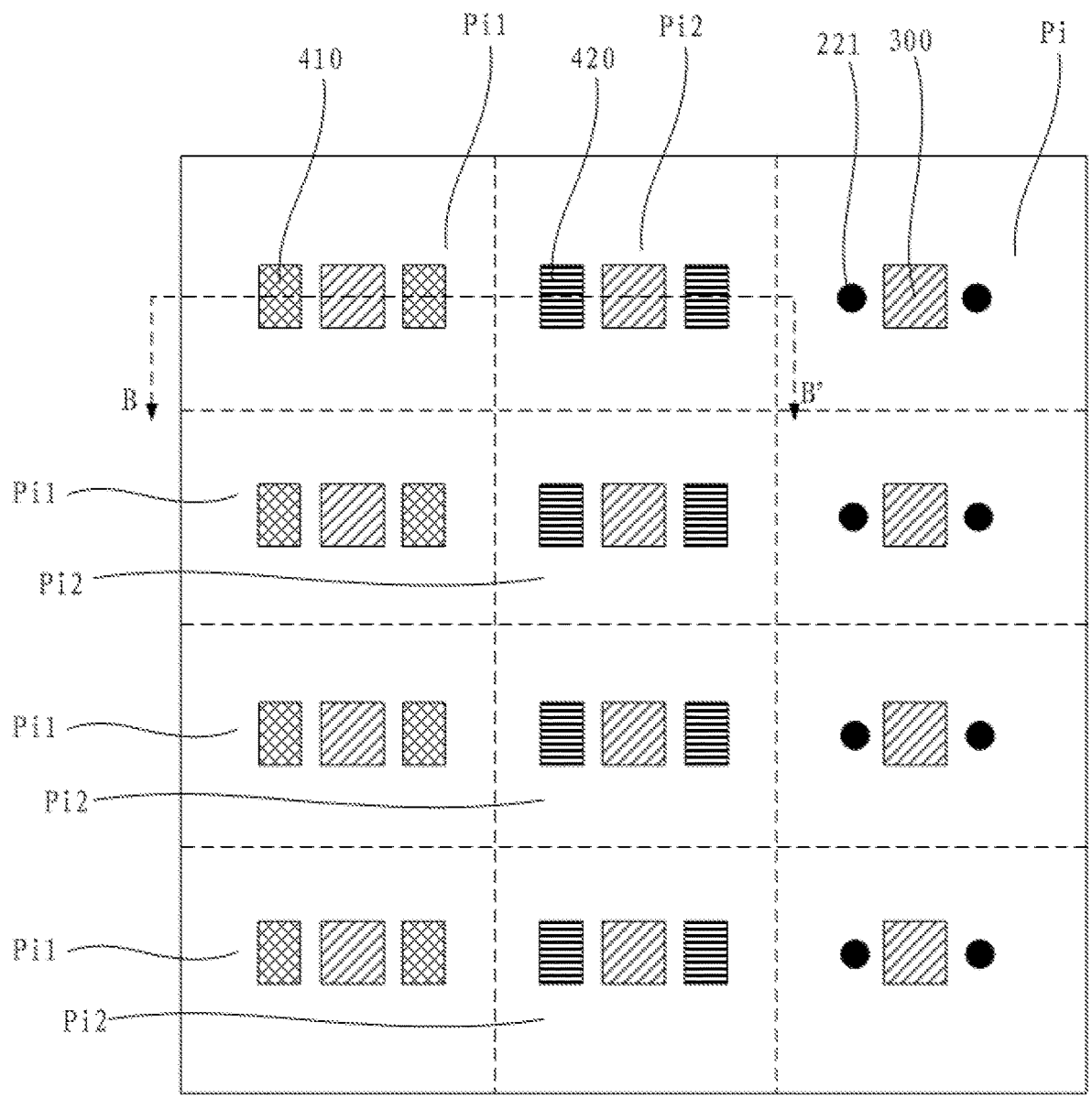
FIG. 3 is a schematic structural diagram of a display panel according to another embodiment of the present disclosure.

In combination of FIGS. 1 and 2, FIG. 1 is a schematic structural diagram of a display panel according to an embodiment of the present disclosure, and FIG. 2 is a section diagram of FIG. 1 in an AA' direction. In an embodiment of the present disclosure, a display panel is provided. The display panel includes a first substrate 100, and a second substrate 200 opposite to the first substrate 100. The display panel includes multiple pixel unit regions Pi.

In the pixel unit region Pi, the second substrate 200 includes a base 210, a light-emitting element 300 on a side of the base 210 facing the first substrate 100, and a driving circuit layer between the light-emitting element 300 and the base 210. The light-emitting element 300 is configured to generate a first color light. The pixel unit region Pi includes a first pixel unit region Pi1 configured to generate the first color light. The driving circuit layer 220 includes multiple via holes 221.

In the first pixel unit region Pi1, the display panel includes at least one first light-shielding portion 410 on a side of the via hole 221 away from the base 210. A first light-shielding orthographic projection 410' of the first light-shielding portion 410 on the base 210 covers a via hole orthographic projection 221' of at least one via hole 221 on the base 210.

It should be noted that the via hole 221 provided in the embodiments of the present disclosure is a structure formed by punching and metallizing an isolation structure between the wiring layers to connect different wiring layers. The via hole 221 can reflect light emitted by the light-emitting element 300, and the phenomenon of light crosstalk occurs between adjacent pixel unit regions Pi. An example of light crosstalk is as follows. For example, when the display device displays images, in the case that the first pixel unit region Pi1 does not emit light and other pixel unit regions Pi emit light, light emitted by the light-emitting elements 300 at other pixel unit regions Pi can irradiate the via hole 221 in the first pixel unit region Pi1, the via hole 221 will reflect light to the first light-emitting unit region Pi1. In this case, a bright spot of the first color light will appear at the first light-emitting unit region Pi1, to deteriorate the display effect of the display device.

In the embodiments of the present disclosure, in the first pixel unit region Pi1, an orthographic projection of the first light-shielding portion 410 on the base 210 covers an orthographic projection of at least one via hole 221 on the base 210. Thus, the first light-shielding portion 410 shields light which is emitted by the adjacent light-emitting element 300 and reflected by the via hole 221. In addition, the first light-shielding portion 410 can further shield the light which is emitted by the light-emitting element 300 in the first pixel unit region Pi1 to the via hole 221, to avoid reflecting the light to the adjacent pixel unit region Pi by the via hole 221 in the first pixel unit region Pi1, prevent the light emitted by the adjacent light-emitting element 300 from affecting the emergent light at the first pixel unit region Pi1, and prevent the light emitted by the light-emitting element 300 in the first pixel unit region Pi1 from affecting the emergent light at the adjacent pixel unit region Pi. In this way, the light crosstalk between adjacent light-emitting elements is reduced, and a good display effect of the display device is ensured.

In an embodiment, as shown in FIG. 2, the dotted arrow in FIG. 2 is emergent light of the light-emitting element 300. In one embodiment, in the first pixel unit region Pi1, by disposing the first light-shielding portion 410, the emergent light of the light-emitting element 300 can be blocked by the first light-shielding portion 410, to avoid that the emergent light of the light-emitting element 300 irradiate the via hole 221 and then reflected by the via hole 221 to the adjacent pixel unit region Pi, to affect the emergent light at the adjacent pixel unit region Pi. On the other hand, at the pixel unit region Pi adjacent to the first pixel unit region Pi1, the emergent light of the light-emitting element 300 can enter the via hole 221 at the first pixel unit region Pi1. However, the first light-shielding portion 410 can block light reflected by the via hole 221. Therefore, the light reflected by the via hole 221 in the first pixel unit region Pi1 cannot affect the emergent light of the first pixel unit region Pi1. In this way, the light crosstalk between adjacent light-emitting elements 300 can be improved.

Figure 4:
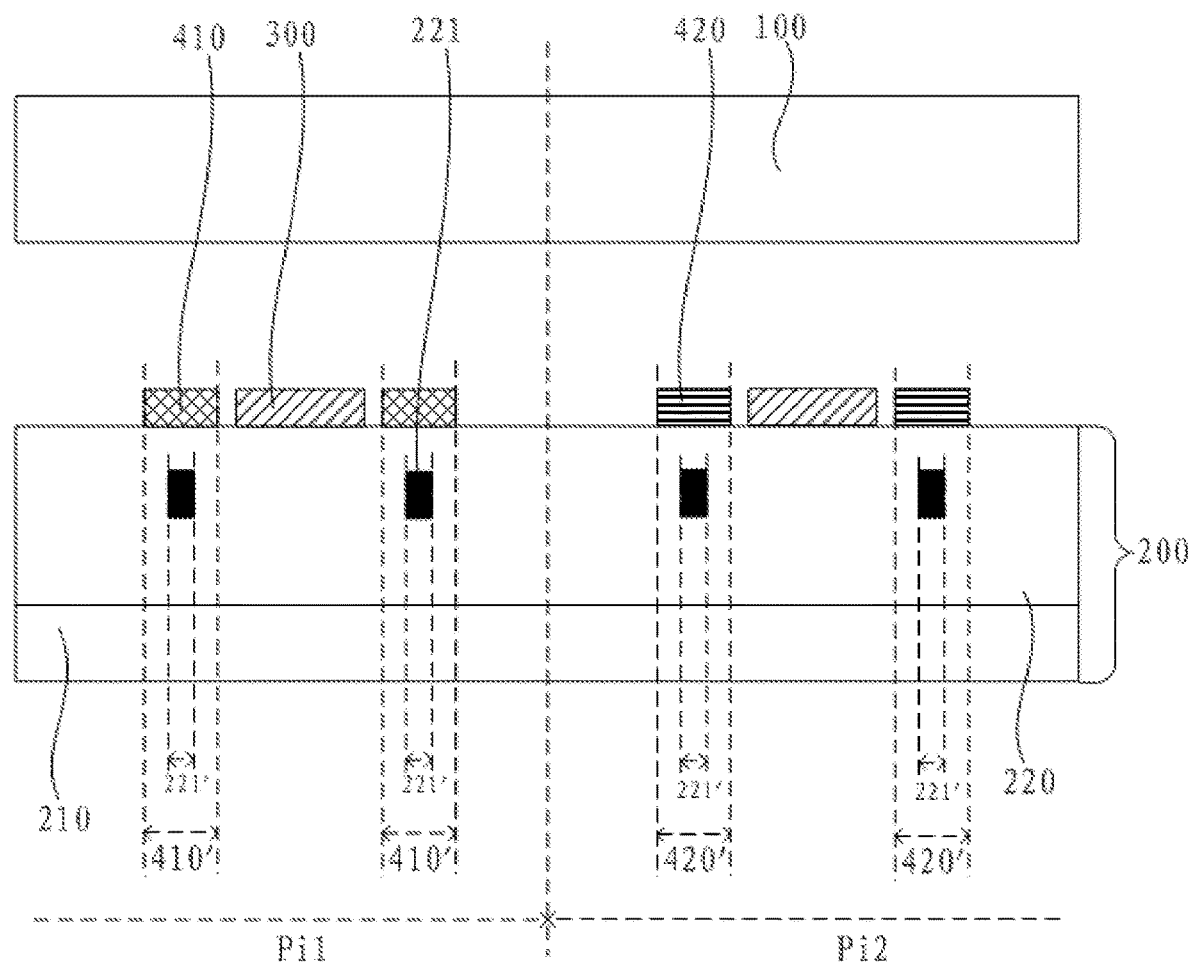
FIG. 4 is a section diagram of FIG. 3 in a BB' direction.

In an embodiment of the present disclosure, the display panel according to the present disclosure includes a pixel unit region for generating other color light. For example, the pixel unit region includes a second pixel unit region for generating second color light. The second color light is obtained by converting the first color light generated by the light-emitting element. In an embodiment, the via hole in the second pixel unit region can also be shielded by the light-shielding structure to avoid affecting the emergent light of the second pixel unit region. In combination of FIGS. 3 and 4, FIG. 3 a schematic structural diagram of a display panel according to another embodiment of the present disclosure, and FIG. 4 is a section diagram of FIG. 3 in a BB' direction. The pixel unit region Pi includes a second pixel unit region Pi2 for generating second color light.

In the second pixel unit region Pi2, the display panel includes at least one second light-shielding portion 420 at a side of the via hole 221 away from the base 210. A second light-shielding orthographic projection 420' of the second light-shielding portion 420 on the base 210 covers a via hole orthographic projection 221' of at least one via hole 221 on the base 210.

In the embodiments of the present disclosure, in the first pixel unit region Pi1, the orthographic projection of the first light-shielding portion 410 on the base 210 covers the orthographic projection of at least one via hole 221 on the base 210. Thus, the first light-shielding portion 410 can shield light which is emitted by the adjacent light-emitting element 300 and reflected by the via hole 221, to prevent the light emitted by the adjacent light-emitting element 300 from affecting the emergent light at the first pixel unit region Pi1.

In addition, in the second pixel unit region Pi2, an orthographic projection of the second light-shielding portion 420 on the base 210 covers an orthographic projection of at least one via hole 221 on the base 210. Thus, the second light-shielding portion 420 can shield light which is emitted by the adjacent light-emitting elements 300 and reflected by the via hole 221, to prevent the light emitted by the adjacent light-emitting element 300 from affecting the emergent light at the second pixel unit region Pi2. In this way, the light crosstalk between adjacent light-emitting elements can be reduced, and the good display effect of the display device is ensured.

Figure 5:
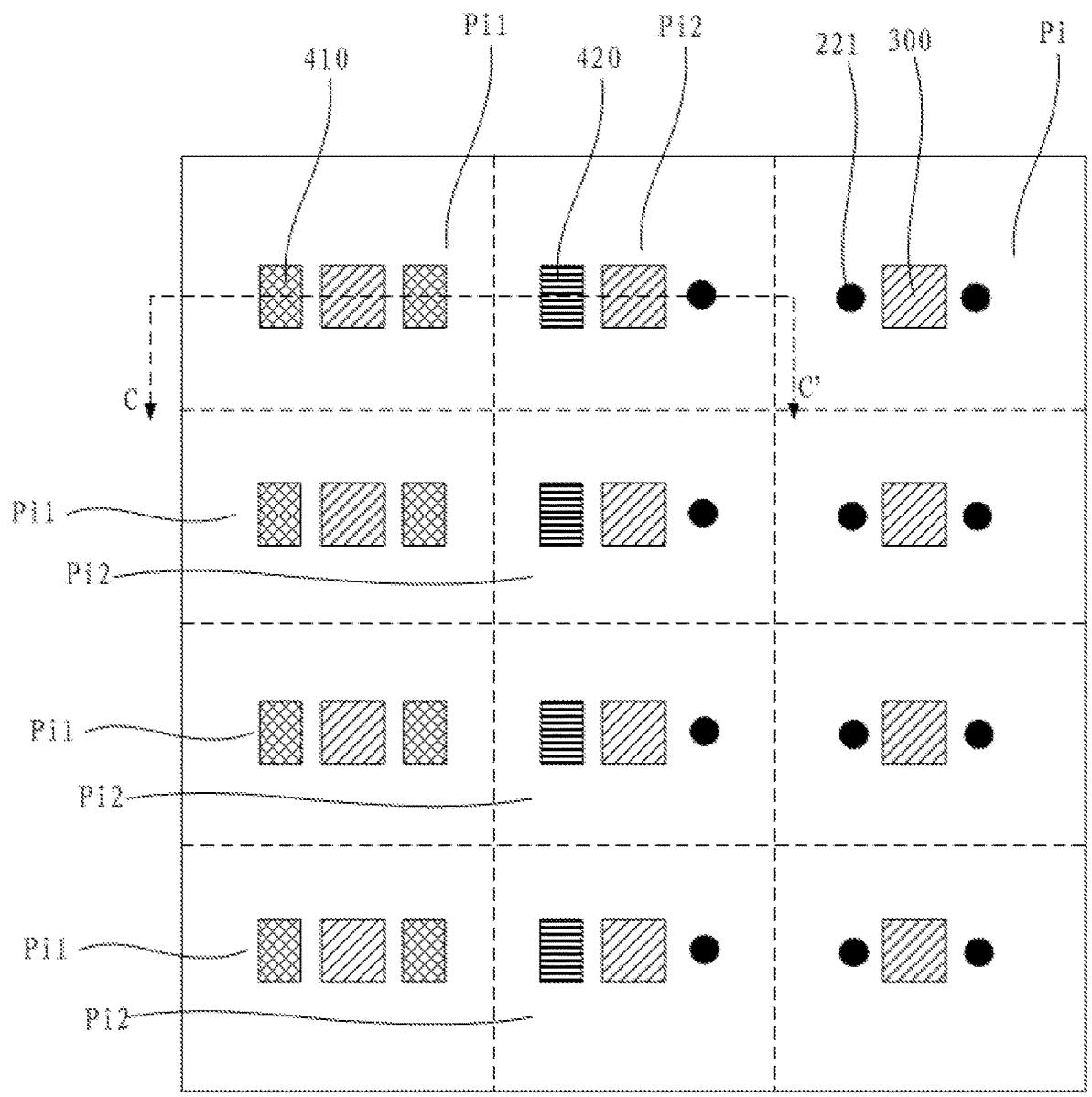
FIG. 5 is a schematic structural diagram of a display panel according to another embodiment of the present disclosure.
Figure 6:
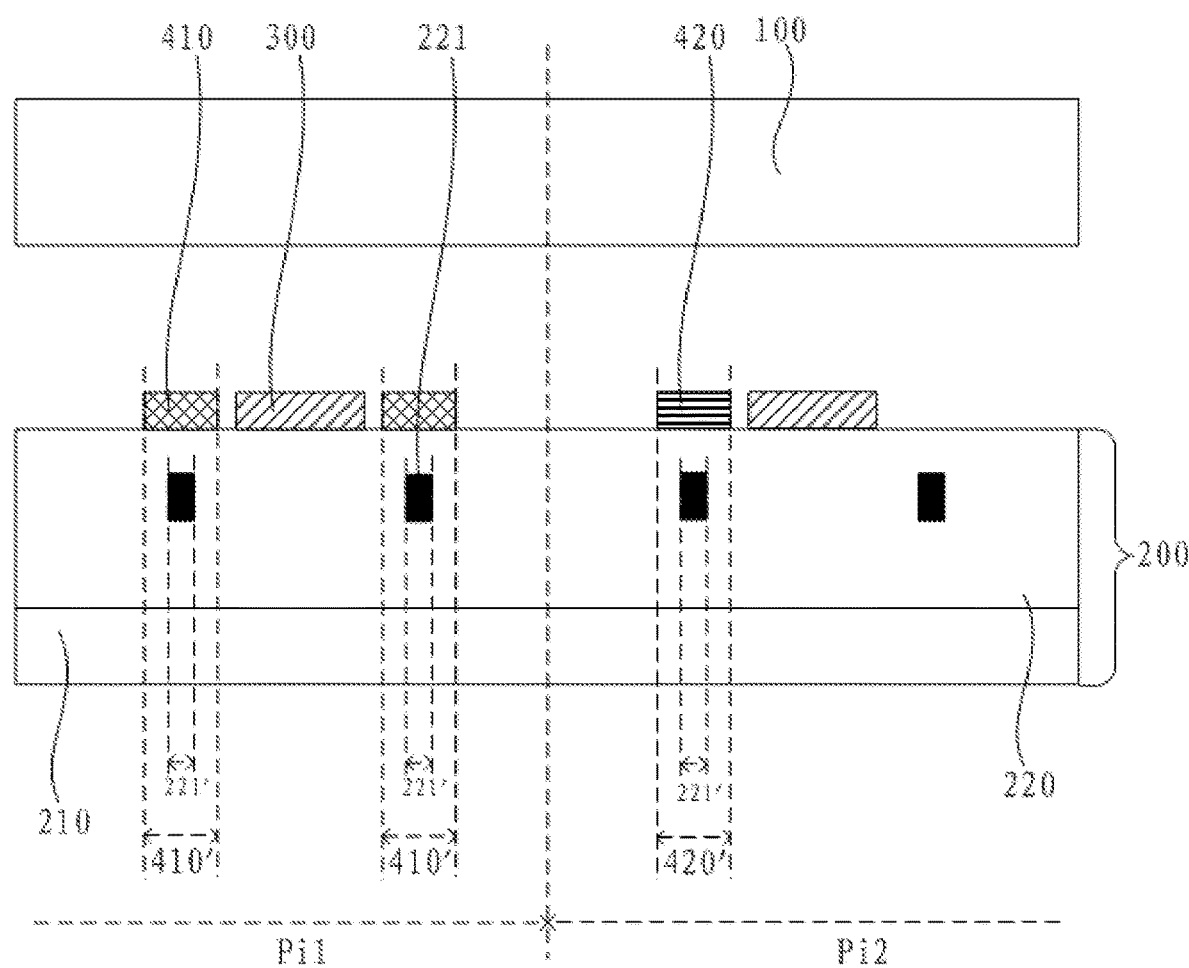
FIG. 6 is a section diagram of FIG. 5 in a CC' direction.

In an embodiment of the present disclosure, the second color light generated in the second pixel unit region provided by an embodiment of the present disclosure is obtained by converting the first color light. Therefore, at the second pixel unit region, the first color light reflected by the via hole needs to be converted into the second color light, and then the converted second color light can be emitted. Therefore, compared with the first pixel unit region at which the first color light does not need to be converted, the number of second light-shielding portions for shielding the via hole at the second pixel unit region may be relatively small, and/or the number of the second light-shielding portions for shield the same via hole at the second pixel unit region may be relatively small. In combination of FIGS. 5 and 6, FIG. 5 is a schematic structural diagram of a display panel according to another embodiment of the present disclosure, and FIG. 6 is a section diagram of FIG. 5 in a CC' direction. The number of via hole orthographic projections 221' covered by the first light-shielding orthographic projection 410' at the first pixel unit region Pi1 is greater than that covered by the second light-shielding orthographic projection 420' at the second pixel unit region Pi2. In other words, in the case that the number of the first pixel unit regions Pi1 is the same as the number of the second pixel unit regions Pi2 and the number of via holes 221 in the first pixel unit region Pi1 is the same as that in the second pixel unit region Pi2, the number of via holes 221 shielded by the second light-shielding portion 420 in the second pixel unit region Pi2 is less than that shielded by the first light-shielding portion 410 in the first pixel unit region Pi1. The positions and the number of the shielded via holes 221 in each first pixel unit region Pi1 and each second pixel unit region Pi2 will not be limited in the embodiment of the present disclosure.

Figure 7:
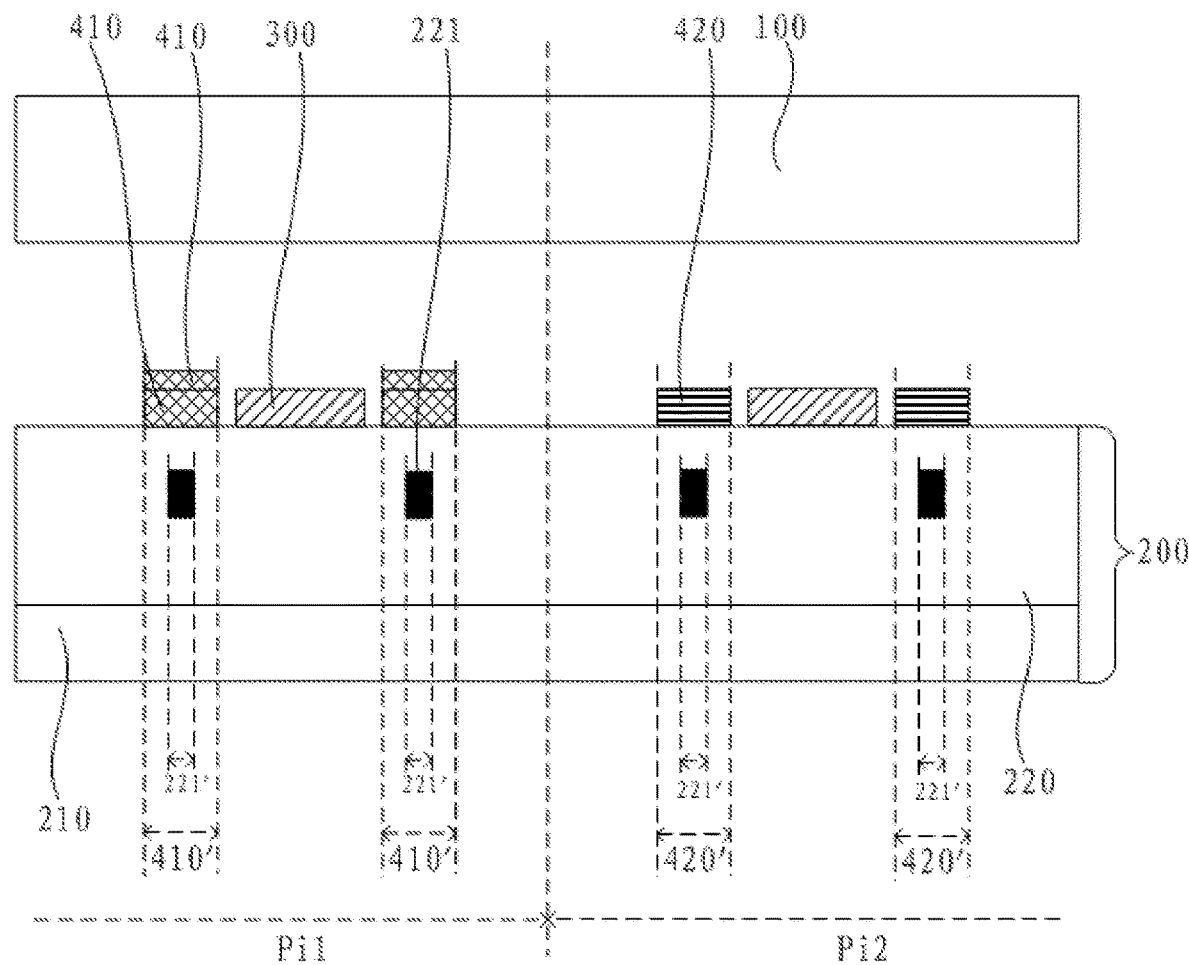
FIG. 7 is a schematic structural diagram of a display panel according to another embodiment of the present disclosure.

In an embodiment, FIG. 7 is a schematic structural diagram of a display panel according to another embodiment of the present disclosure. As shown in FIG. 7, the number of first light-shielding orthographic projection 410' covering the same via hole orthographic projection 221' in the first pixel unit region Pi1 is greater than the number of second light-shielding orthographic projection 420' covering the same via hole orthographic projection 221' in the second pixel unit region Pi2. That is, the same via hole 221 in the first pixel unit region Pi1 may be covered by multiple first light-shielding portions 410. Compared with the first pixel unit region Pi1, the same via hole 221 in the second pixel unit region Pi2 can be covered by one or fewer second light-shielding portions 420, to improve the light-shielding effect at the first pixel unit region Pi1 and ensuring the good display effect of the display panel.

Figure 8:
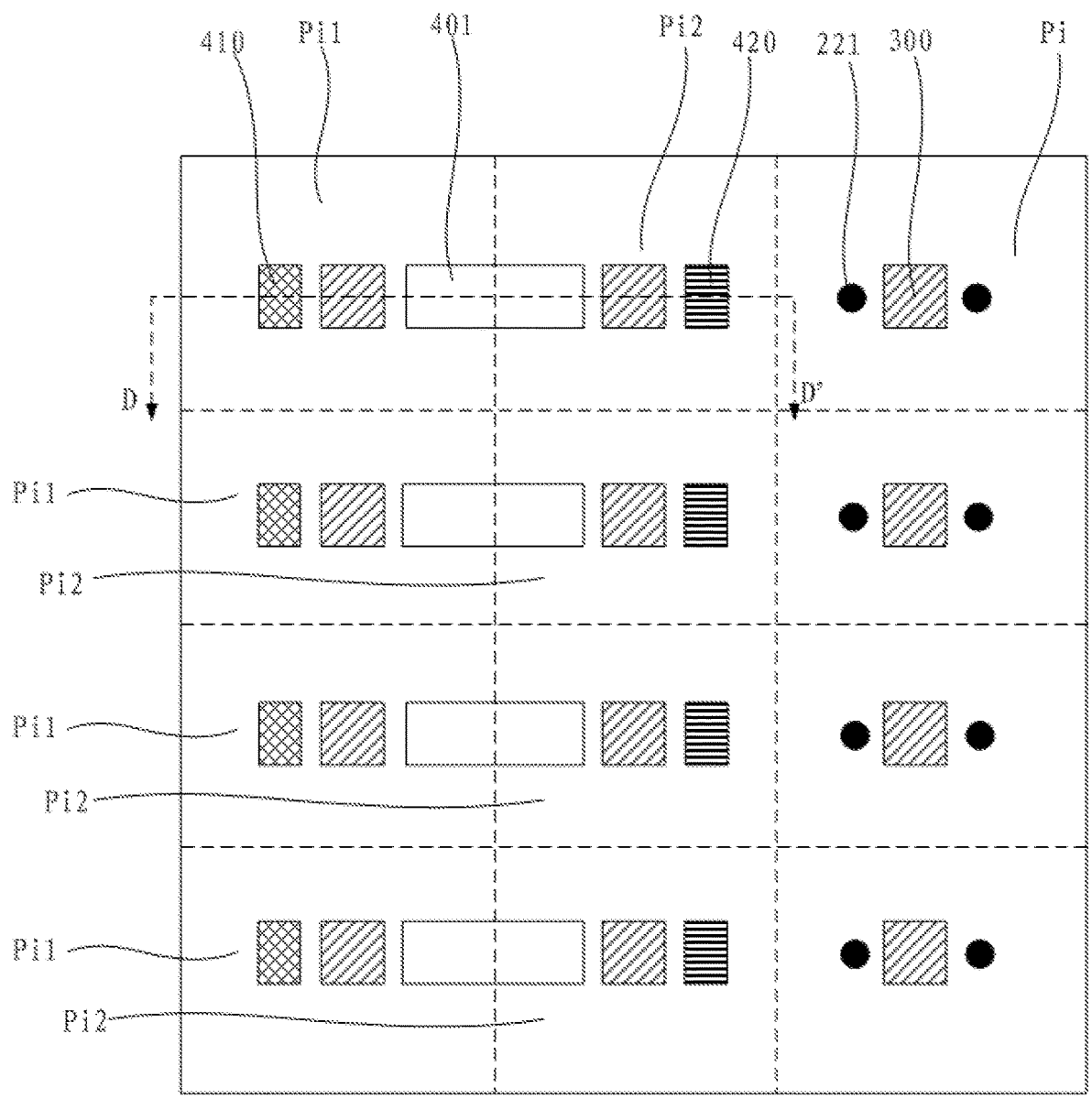
FIG. 8 is a schematic structural diagram of a display panel according to another embodiment of the present disclosure.
Figure 9:
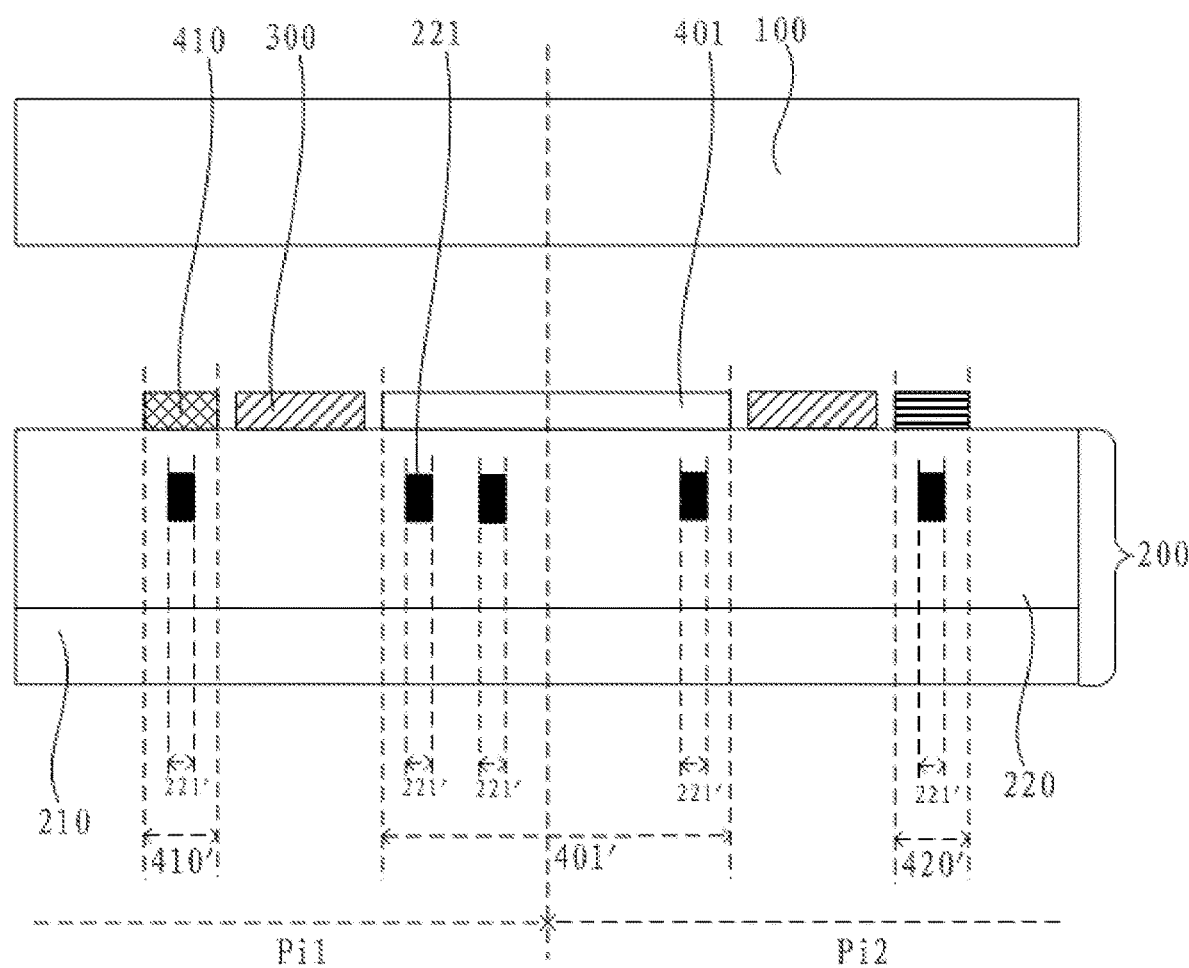
FIG. 9 is a section diagram of FIG. 8 in a DD' direction.

In combination of FIGS. 8 and 9, FIG. 8 is a schematic structural diagram of a display panel according to another embodiment of the present disclosure, and FIG. 9 is a section diagram of FIG. 8 in a DD' direction. At least one first light-shielding portion 410 and at least one second light-shielding portion 420 are the same first multiplexing light-shielding portion 401. The number of via hole orthogonal projections 221', covered by an orthographic projection 401' of the first multiplexing light-shielding portion 401 on the base 210, in the first pixel unit region Pi1 is greater than the number of via hole orthogonal projection 221' in the second pixel unit region Pi2. In the second pixel unit region Pi2, the first color light needs to be converted into the second color light to output. Thus, compared to the first pixel unit region Pi1 which directly outputs the first color light, a light-shielding requirement for the via hole 221 in the second pixel unit region Pi2 is relatively low. Therefore, in the present disclosure, the first multiplexing light-shielding portion 401 is designed to prioritize the cover of the via hole 221 in the first pixel unit region Pi1, which can ensure the good display effect of the display device.

Figure 10:
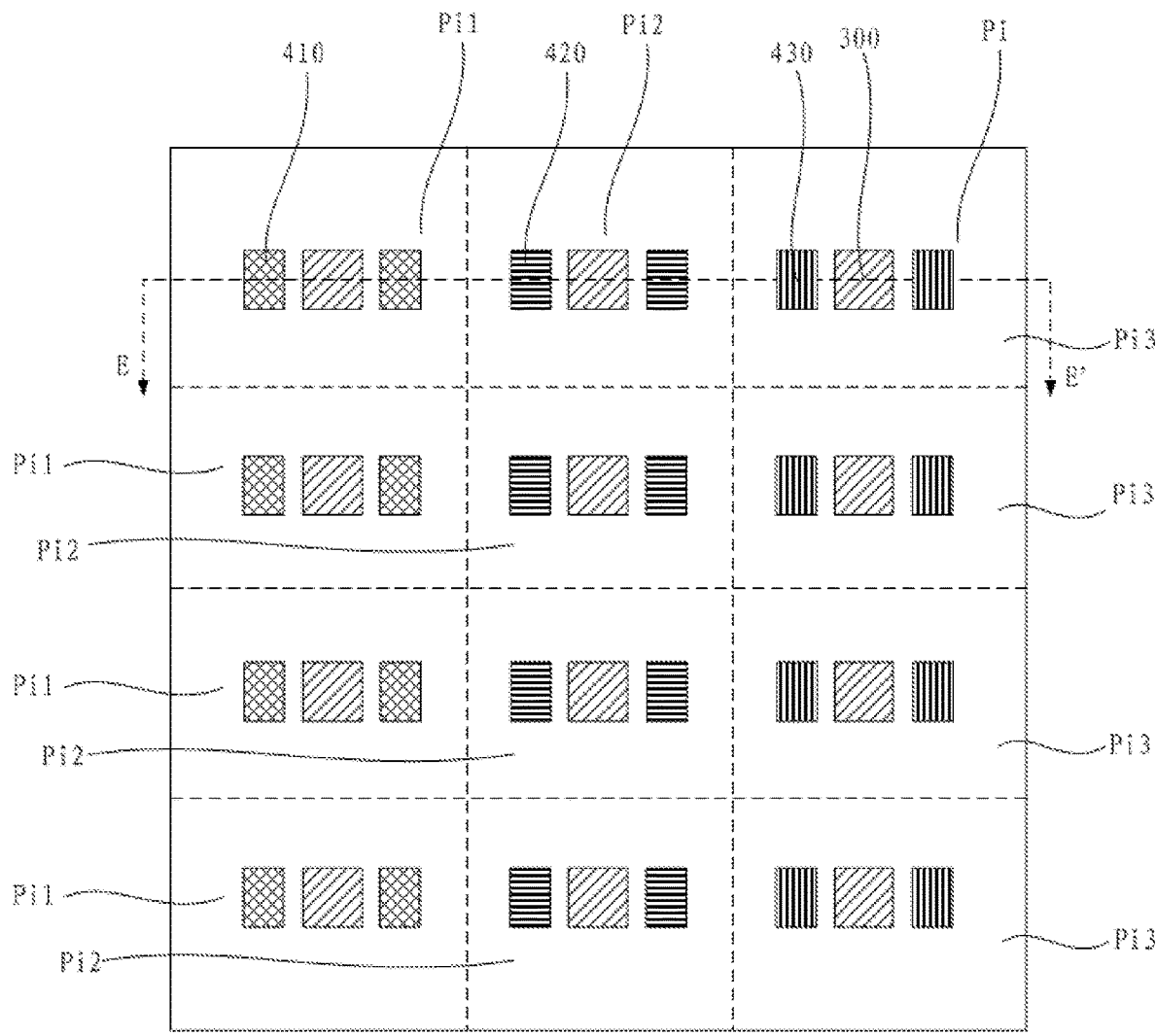
FIG. 10 is a schematic structural diagram of a display panel according to another embodiment of the present disclosure.
Figure 11:
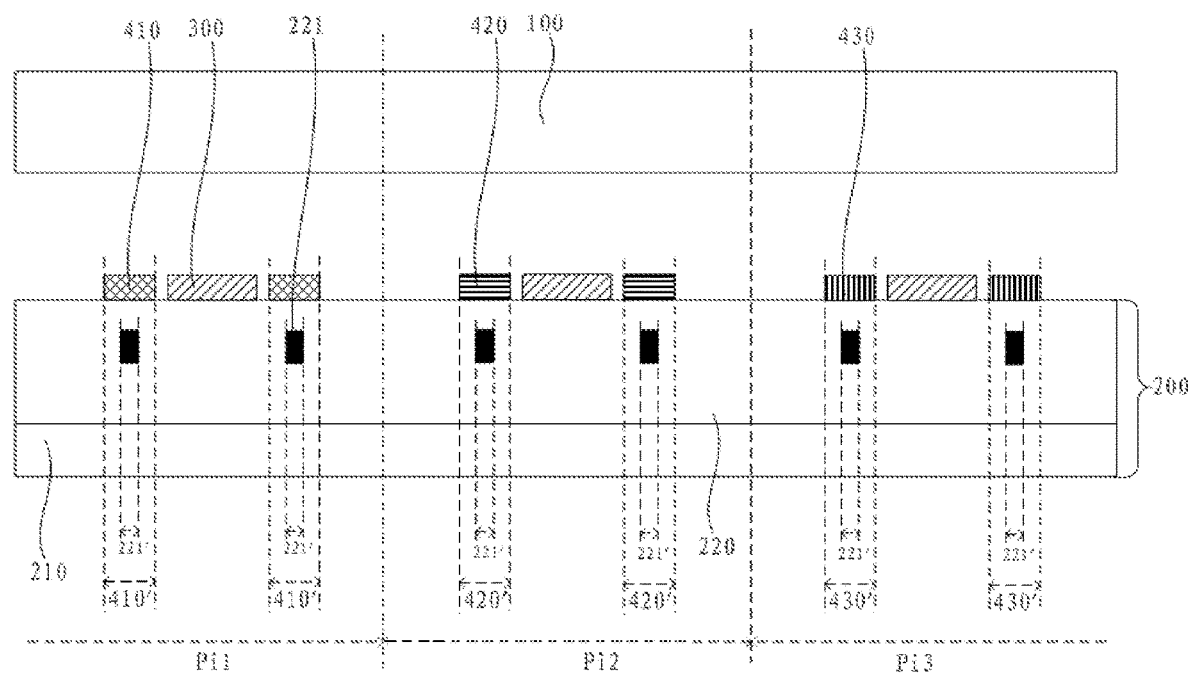
FIG. 11 is section diagram of FIG. 10 in a EE' direction.

In an embodiment of the present disclosure, the display panel according to the present disclosure includes a pixel unit region for generating other color light. For example, the pixel unit region includes a second pixel unit region for generating second color light. The second color light is obtained by converting the first color light generated by the light-emitting element. In addition, the pixel unit region further includes a third pixel unit region for generating third color light. The third color light is obtained by converting the first color light generated by the light-emitting element. The via hole in the third pixel unit region can also be shielded by the light-shielding structure to avoid affecting the emergent light of this region. In an embodiment, in combination of FIGS. 10 and 11, FIG. 10 is a schematic structural diagram of a display panel according to another embodiment of the present disclosure, and FIG. 11 is section diagram of FIG. 10 in a EE' direction. The pixel unit region Pi includes a third pixel unit region Pi3 for generating third color light.

In the third pixel unit region Pi3, the display panel includes at least one third light-shielding portion 430 located at a side of the via hole 221 away from the base 210. A third light-shielding orthographic projection 430' of the third light-shielding portion 430 on the base 210 covers a via hole orthographic projection 221' of at least one via hole 221 on the base 210.

In the embodiments of the present disclosure, in the first pixel unit region Pi1, the orthographic projection of the first light-shielding portion 410 on the base 210 covers the orthographic projection of at least one via hole 221 on the base 210. Thus, the first light-shielding portion 410 can shield light which is emitted by the adjacent light-emitting element 300 and reflected by the via hole 221, to prevent the light emitted by the adjacent light-emitting element 300 from affecting the emergent light at the first pixel unit region Pi1.

In addition, in the second pixel unit region Pi2, an orthographic projection of the second light-shielding portion 420 on the base 210 covers an orthographic projection of at least one via hole 221 on the base 210. Thus, the second light-shielding portion 420 can shield light which is emitted by the adjacent light-emitting element 300 and reflected by the via hole 221, to prevent the light emitted by the adjacent light-emitting element 300 from affecting the emergent light at the second pixel unit region Pi2.

In addition, in the third pixel unit region Pi3, an orthographic projection of the third light-shielding portion 430 on the base 210 covers an orthographic projection of at least one via hole 221 on the base 210. Thus, the third light-shielding portion 430 can shield the light which is emitted by the adjacent light-emitting element 300 and reflected by the via hole 221, to prevents the light emitted by the adjacent light-emitting element 300 from affecting the emergent light at the third pixel unit region Pi3. In this way, the light crosstalk between adjacent light-emitting elements is reduced, and the good display effect of the display device is ensured.

Figure 12:
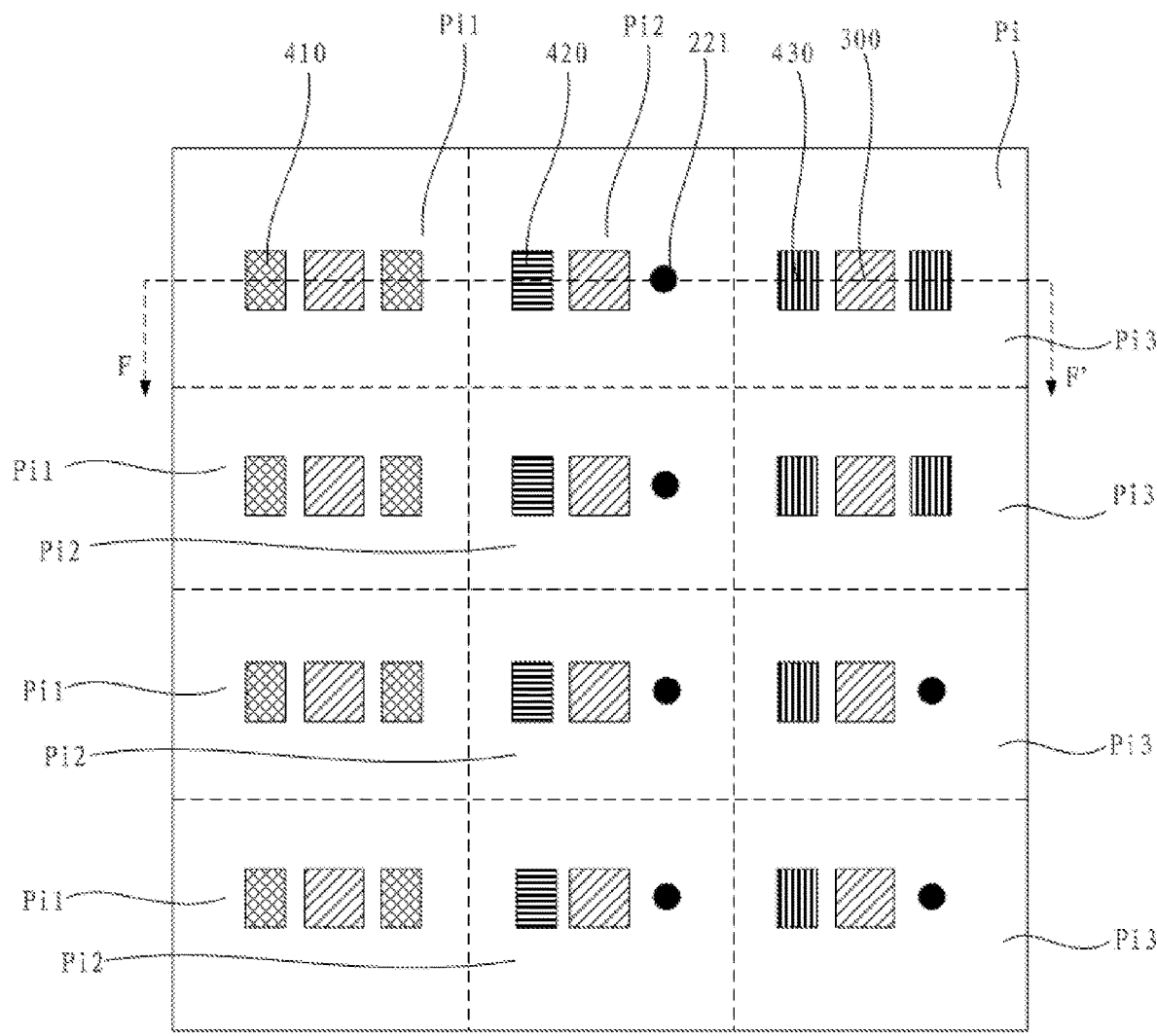
FIG. 12 is a schematic structural diagram of a display panel according to another embodiment of the present disclosure.
Figure 13:
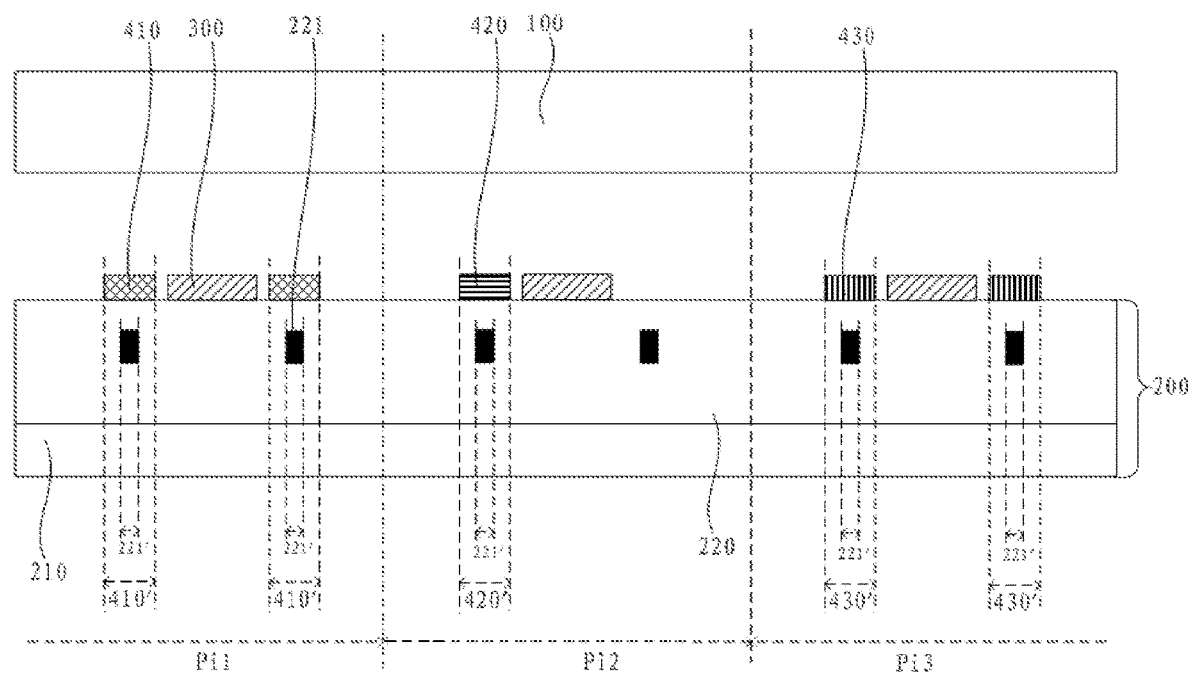
FIG. 13 is a section diagram of FIG. 12 in a FF' direction.

In an embodiment of the present disclosure, the third color light generated in the third pixel unit region provided by an embodiment of the present disclosure is obtained by converting the first color light. Therefore, at the third pixel unit region, the first color light reflected by the via hole needs to be converted into a third color light and then the converted third color light can be emitted. Therefore, compared the first pixel unit region at which the first color light does not need to be converted, the number of third light-shielding portions for shielding the via hole at the third pixel unit region can be relatively small, and/or the number of third light-shielding portions for shielding the same via hole can be relatively small. In combination of FIGS. 12 and 13, FIG. 12 is a schematic structural diagram of a display panel according to another embodiment of the present disclosure, and FIG. 13 is a section diagram of FIG. 12 in a FF' direction. The number of via hole orthographic projections 221' covered by the first light-shielding orthographic projection 410' at the first pixel unit region Pi1 is greater than that covered by the third light-shielding orthographic projection 430' at the third pixel unit region Pi3. That is, in the case that the number of the first pixel cell regions Pi1 is the same as the number of the third pixel unit regions Pi3 and the number of via holes 221 in the first pixel unit region Pi1 is the same as that in the third pixel unit region Pi3, the number of via holes 221 shielded by the third light-shielding portion 430 in the third pixel unit region Pi3 is less than that shielded by the first light-shielding portion 410 in the first pixel unit region Pi1. The positions and the number of the shielded via holes 221 in each first pixel unit region Pi1 and each third pixel unit region Pi3 will not be limited in the embodiment of the present disclosure.

Figure 14:
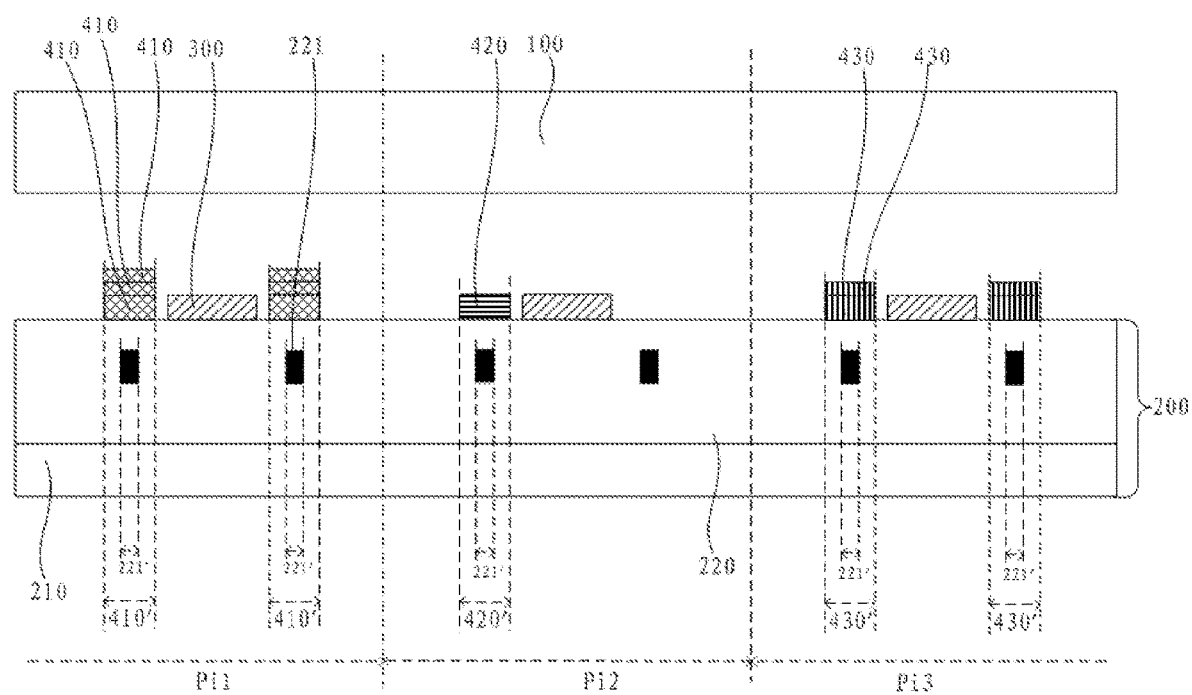
FIG. 14 is a schematic structural diagram of a display panel according to another embodiment of the present disclosure.

In an embodiment, FIG. 14 is a schematic structural diagram of a display panel according to another embodiment of the present disclosure. As shown in FIG. 14, the number of first light-shielding orthographic projection 410' covering the same via hole orthographic projection 221' in the first pixel unit region Pi1 is greater than the number of third light-shielding orthographic projection 430' covering the same via hole orthographic projection 221' in the third pixel unit region Pi3. That is, the same via hole 221 in the first pixel unit region Pi1 may be covered by multiple first light-shielding portions 410. Compared with the first pixel unit region Pi1, the same via hole 221 in the third pixel unit region Pi3 can be covered by one or fewer third light-shielding portions 430, to improve the light-shielding effect at the first pixel unit region Pi1, and ensuring the good display effect of the display panel.

In an embodiment of the present disclosure, light-emitting conversion efficiency of the light-emitting element 300 in the second pixel unit region Pi2 according to the present disclosure is less than that in the third pixel unit region Pi3. That is, the conversion efficiency of the first color light at the second pixel unit region Pi2 is less than that at the third pixel unit region Pi3. Compared with the second pixel unit region Pi2, the third pixel unit region Pi3 has higher conversion efficiency for the first color light, thus the third pixel unit region Pi3 has a higher light-shielding requirement for the via hole 221. As shown in FIG. 12 and FIG. 13, the number of via hole orthographic projection 221' covered by the third light-shielding orthographic projection 430' at the third pixel unit region Pi3 is greater than that covered by the second light-shielding orthographic projection 420' at the second pixel unit region Pi2. That is, in the case that the number of the second pixel unit region Pi2 is the same as the number of the third pixel unit region Pi3 and the number of via holes 221 in the second pixel unit region Pi2 is the same as that in the third pixel unit region Pi3, the number of via holes 221 shielded by the second light-shielding portion 420 in the second pixel unit region Pi2 is less than that shielded by the first light-shielding portion 430 in the third pixel unit region Pi3. The positions and the number of the shielded via holes 221 in each third pixel unit region Pi3 and each second pixel unit region Pi2 will not be limited in the embodiment of the present disclosure.

In an embodiment, as shown in FIG. 14, the number of third light-shielding orthographic projection 430' covering the same via hole orthographic projection 221' in the third pixel unit region Pi3 according to an embodiment of the present disclosure is greater than the number of second light-shielding orthographic projection 420' covering the same via hole orthographic projection 221' in the second pixel unit region Pi2. That is, the same via hole 221 in the third pixel unit region Pi3 may be covered by multiple third light-shielding portions 430. Compared to the third pixel unit region Pi3, the same via hole 221 in the second pixel unit region Pi2 can be covered by one or fewer second light-shielding portions 420, to improve the light-shielding effect at the third pixel unit region Pi3 and ensuring the good display effect of the display panel.

Figure 15:
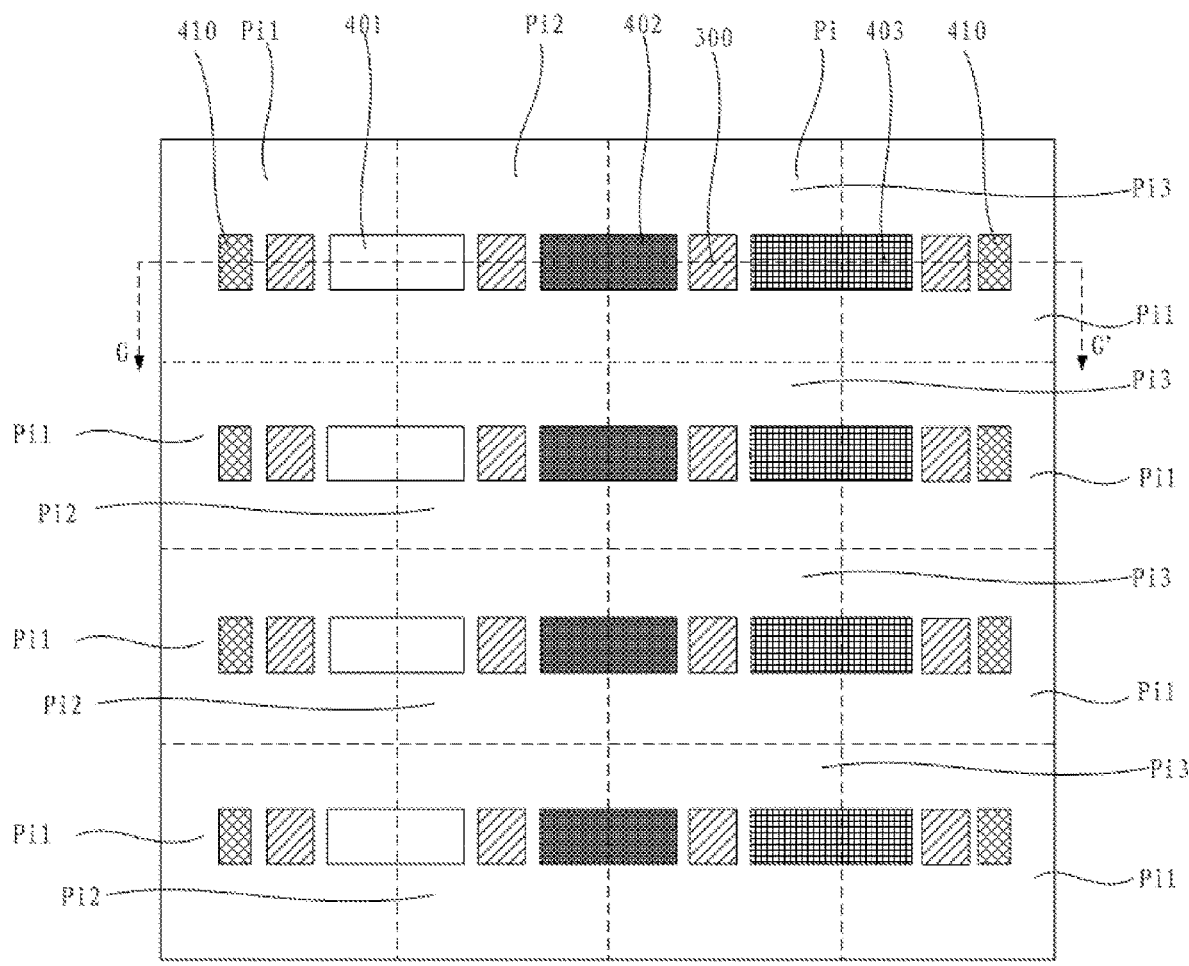
FIG. 15 is a schematic structural diagram of a display panel according to another embodiment of the present disclosure.
Figure 16:
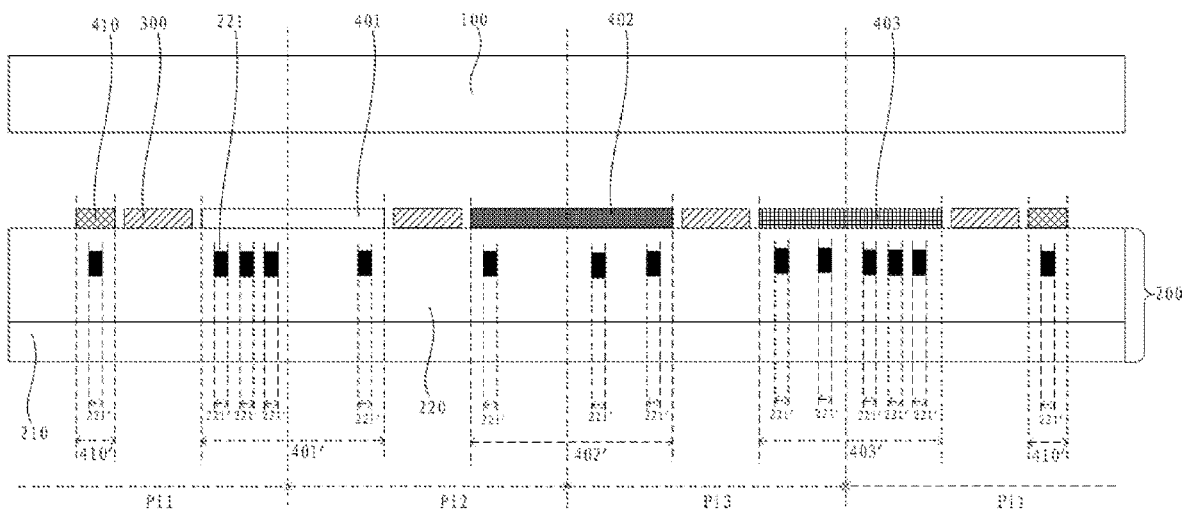
FIG. 16 is a section diagram of FIG. 15 in a GG' direction.

In combination of FIGS. 15 and 16, FIG. 15 is a schematic structural diagram of a display panel according to another embodiment of the present disclosure, and FIG. 16 is a section diagram of FIG. 15 in a GG' direction. At least one first light-shielding portion 410 and at least one the third light-shielding portion 430 are the same second multiplexing light-shielding portion 402. The number of via hole orthogonal projections 221', covered by an orthographic projection 402' of the second multiplexing light-shielding portion 402 on the base 210, in the first pixel unit region Pi1 is greater than the number of via hole orthogonal projection 221' in the third pixel unit region Pi3. In the third pixel unit region Pi3, the first color light needs to be converted into the third color light to output. Thus, compared to the first pixel region Pi1 which directly outputs the first color light, a light-shielding requirement for the via hole 221 in the third pixel unit region Pi3 is relatively low. Therefore, in the present disclosure, the second multiplexing light-shielding portion 402 is designed to prioritize the cover of the via hole 221 in the first pixel unit region Pi1, which can ensure the good display effect of the display device.

In an embodiment, as shown in FIGS. 15 and 16, at least one second light-shielding portion 420 and at least one third light-shielding portion 430 are the same third multiplexing light-shielding portion 403. The number of via hole orthogonal projections 221', covered by an orthographic projection 403' of the third multiplexing light-shielding portion 403 on the base 210, in the second pixel unit region Pi2 is less than the number of via hole orthogonal projection 221' in the third pixel unit region Pi3. The conversion efficiency from the first color light to the second color light at the second pixel unit region Pi2 is less than the conversion efficiency from the first color light to the third color light at the third pixel unit region Pi3. Thus, the second pixel unit region Pi2 has a relatively low light-shielding requirement for the via hole 221. Therefore, in the present disclosure, the third multiplexing light-shielding portion 403 is designed to prioritize the cover of the via hole 221 in the third pixel unit region Pi3, which can ensure the good display effect of the display device.

In an embodiment of the present disclosure, the first color light according to the present disclosure may be blue light, the second color light is red light, and the third color light is green light. That is to say, all the light-emitting elements of the display panel generate blue light. At the first pixel unit region, the blue light generated by the light-emitting element can be output directly. At the second pixel unit region, the blue light is converted into the red light to output. At the third pixel unit region, the blue light is converted into the green light to output. In an embodiment of the present disclosure, the blue light can be converted by a quantum dot conversion layer, and a color resist layer can also be used to filter the light to improve the color purity of light.

It can be understood that when the existing display device displays images, the first pixel unit region and the second pixel unit region do not emit light, and the third pixel unit region emits light, that is, when the display device only displays green light images, the light emitted by the light-emitting element at the third pixel unit region can irradiate the adjacent via holes at the first and second pixel unit regions. The via holes may reflect light to the first pixel unit region and the second pixel unit region. Thus, a bright spot of blue light appears at the first pixel unit region, and a bright spot of red light appears at the second pixel unit region, and the display effect of the display device is deteriorated. Similarly, when the display device displays blue light images, red light images or other mixed light images, light crosstalk will occur. In the embodiments of the present disclosure, a light-shielding portion is provided at the pixel unit region, to block a light output channel from the light-emitting element in this pixel unit region to the via hole, and block the emergent light which is emitted by the adjacent light-emitting element and reflected by the via hole. Thus, the light crosstalk at the pixel unit region is reduced.

Figure 17:
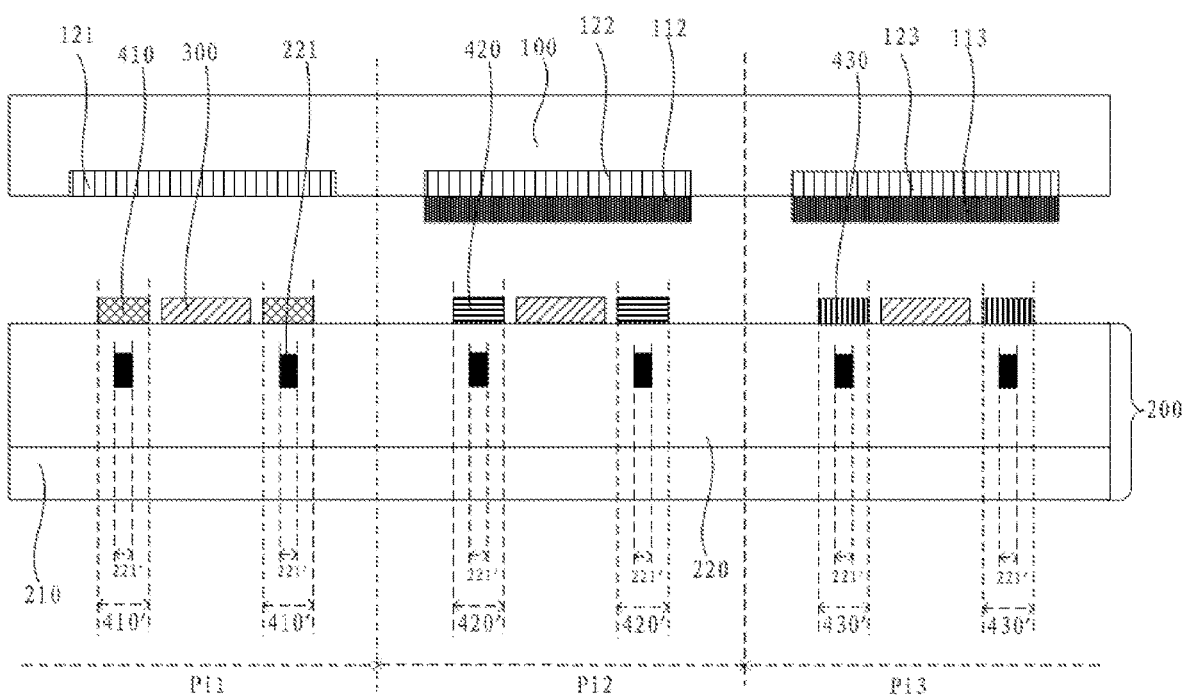
FIG. 17 is a schematic structural diagram of a display panel according to another embodiment of the present disclosure.

FIG. 17 is a schematic structural diagram of a display panel according to another embodiment of the present disclosure. As shown in FIG. 17, in the first pixel unit region Pi1, the first substrate 100 includes a first color resist layer 121. The first color resist layer 121 can transmit the first color light and filter out remaining color light.

In the second pixel unit region Pi2, the first substrate 100 includes a second quantum dot conversion layer 112, and a second color resist 122 on a side of the second quantum dot conversion layer 112 away from the light-emitting element 300. The second color resist 122 can transmit the second color light and filter out remaining color light.

In the third pixel unit region Pi3, the first substrate 100 includes a third quantum dot conversion layer 113, and a third color resist 123 on a side of the third quantum dot conversion layer 113 away from the light-emitting element 300. The third color resist 123 can transmit the third color light and filter out remaining color light.

Figure 18:
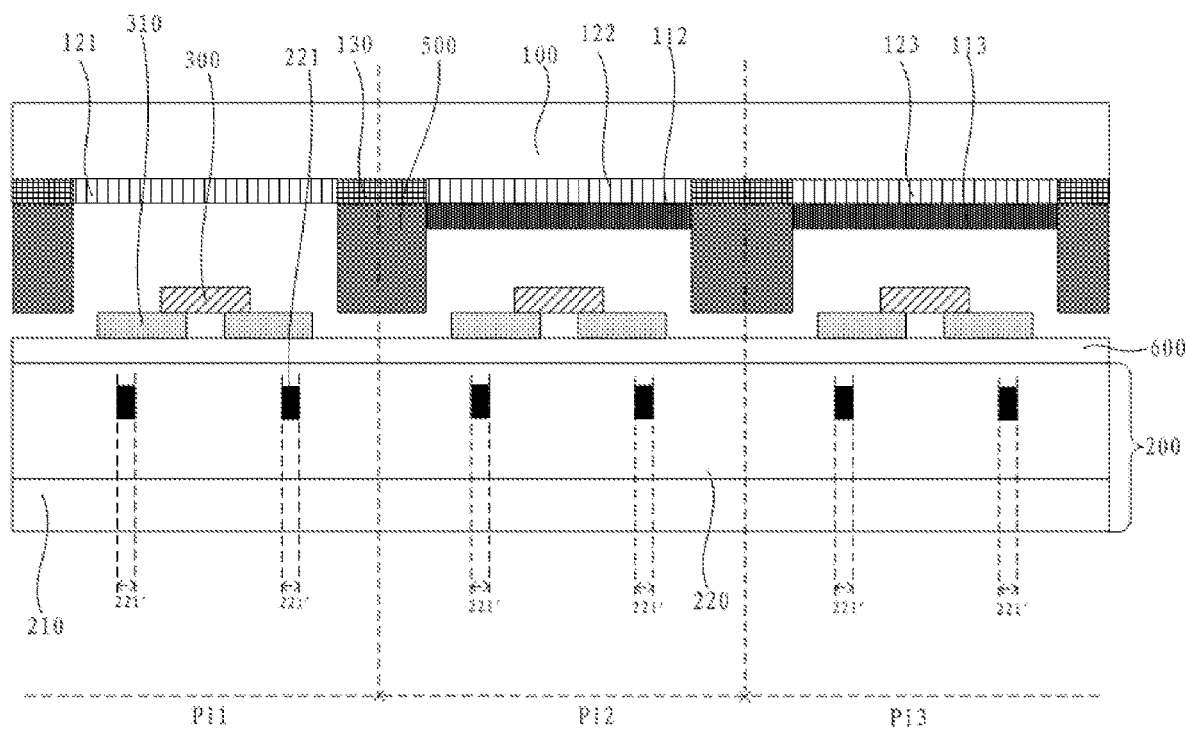
FIG. 18 is a schematic structural diagram of a display panel according to another embodiment of the present disclosure.

FIG. 18 is a schematic structural diagram of a display panel according to another embodiment of the present disclosure. As shown in FIG. 18, at the pixel unit region Pi, the first substrate 100 includes a black matrix layer 130. The black matrix layer 130 includes a light-transmitting area corresponding to the light-emitting element 300. The quantum dot conversion layer and color resist are disposed at the light-transmitting area of the black matrix layer 130. The display panel includes a barrier 500 located between the first substrate 100 and the second substrate 200 and surrounding the light-emitting element 300. The second substrate 200 includes a first insulating layer 600 between the driving circuit layer 220 and the light-emitting element 300, and a connection electrode 310 between the first insulating layer 600 and the light-emitting element 300. The light-shielding portion, which has the orthographic projection on the base 210 covering the via hole orthographic projection 221', includes the black matrix layer 130, the barrier 500, the connection electrode 310, or the light-emitting element 300.

It can be understood that the black matrix layer 130, the barrier 500, the connection electrode 310, and the light-emitting element 300 according to an embodiment of the present disclosure can all be used as the light-shielding structure to shield the reflection of the via hole in the pixel unit region where they are located.

In an embodiment of the present disclosure, the barrier 500 according to the present disclosure is disposed on the first substrate 100 and is located on a side of the black matrix layer 130 facing the second substrate 200. In addition, the barrier is formed in a preparation process of the first substrate 100, and thus the preparation process of the second substrate 200 is simplified.

Figure 19:
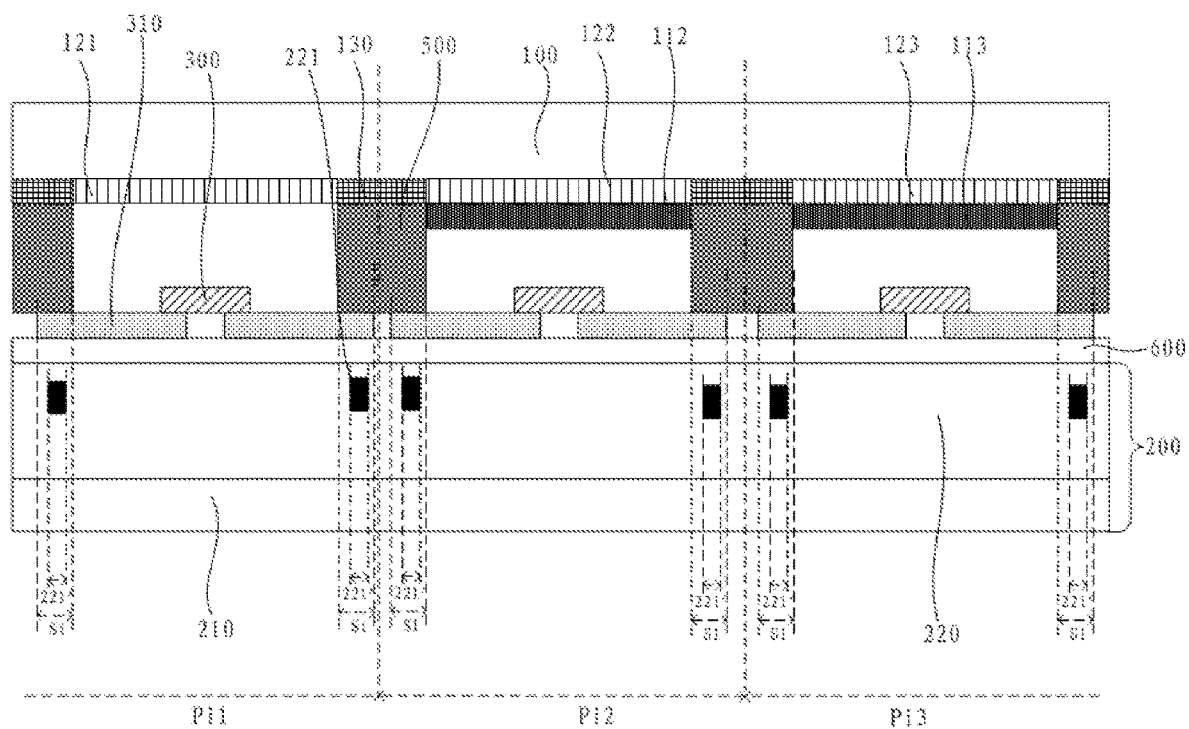
FIG. 19 is a schematic structural diagram of a display panel according to another embodiment of the present disclosure.

FIG. 19 is a schematic structural diagram of a display panel according to another embodiment of the present disclosure. As shown in FIG. 19, in at least one of the pixel unit regions Pi, the light-shielding portion includes the connecting electrode 310 and the barrier 500. An orthographic projection of the connecting electrode 310 on the base 210 has a first overlapping region S1 with an orthographic projection of the barrier 500 on the base 210. At least one of the via hole orthographic projections 221' is located in the first overlapping region S1. In an embodiment of the present disclosure, an overlap between the connecting electrode 310 and the barrier 500 may be used to block the light reflection of the via hole 221, to improve the light blocking effect of the light-shield portion and improve the display effect of the display device.

Figure 20:
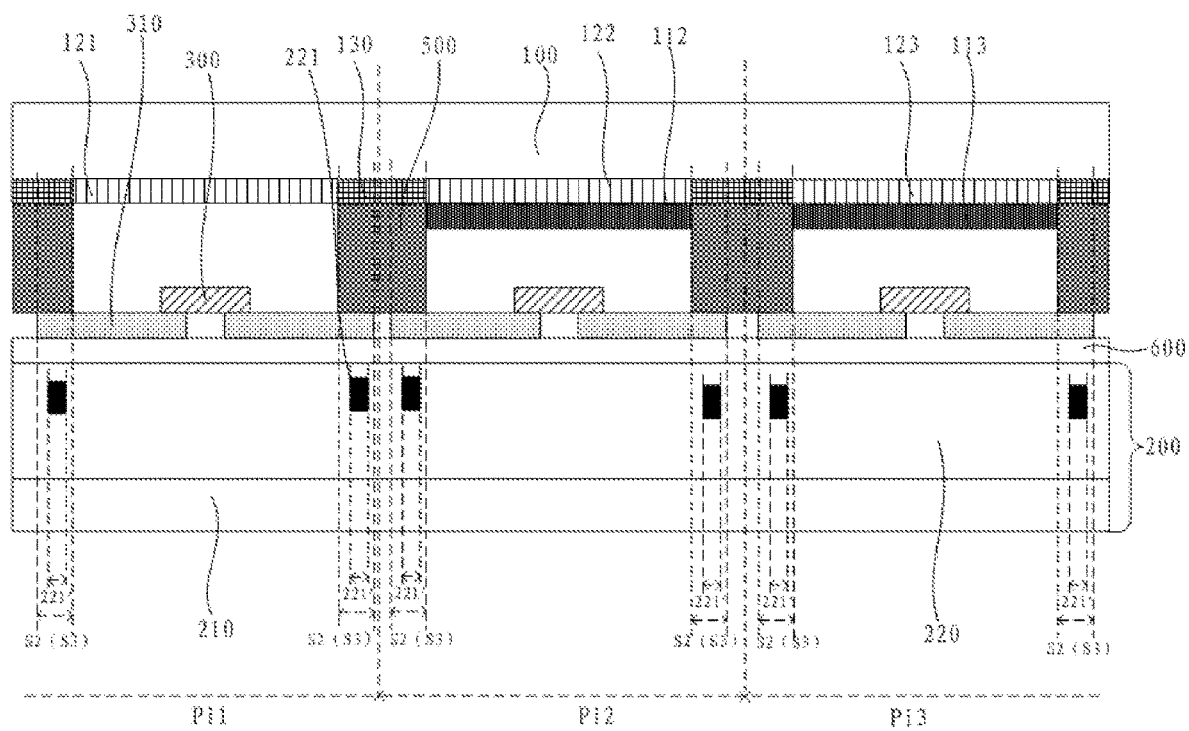
FIG. 20 is a schematic structural diagram of a display panel according to another embodiment of the present disclosure.

FIG. 20 is a schematic structural diagram of a display panel according to another embodiment of the present disclosure. As shown in FIG. 20, in at least one of the pixel unit regions Pi, the light-shielding portion includes the connecting electrode 310 and the black matrix layer 130. An orthographic projection of the connecting electrode 310 on the base 210 has a second overlapping region S2 with an orthographic projection of the black matrix layer 130 on the base 210. At least one of the via hole orthographic projections 221' is located in the second overlapping region S2. In one embodiment, as shown in FIG. 20, in at least one of the pixel unit regions Pi, the light-shielding portion includes the connecting electrode 310, the black matrix layer 130, and the barrier 500. An orthographic projection of the connecting electrode 310 on the base 210 has a third overlapping region S3 with an orthographic projection of the black matrix layer 130 on the base 210 and an orthographic projection of the barrier 500 on the base 210. At least one of the via hole orthographic projections 221' is located in the third overlapping region S3. In an embodiment of the present disclosure, an overlap between the connection electrode 310 and the black matrix layer 130 may be used to block the light reflection of the via hole 221. In one embodiment, an overlap among the connection electrode 310, the black matrix layer 130, and the barrier 500 may be used to block the light reflection of the via hole 221. Thus, the light blocking effect of the light-shielding portion and the display effect of the display device are improved.

Figure 21:
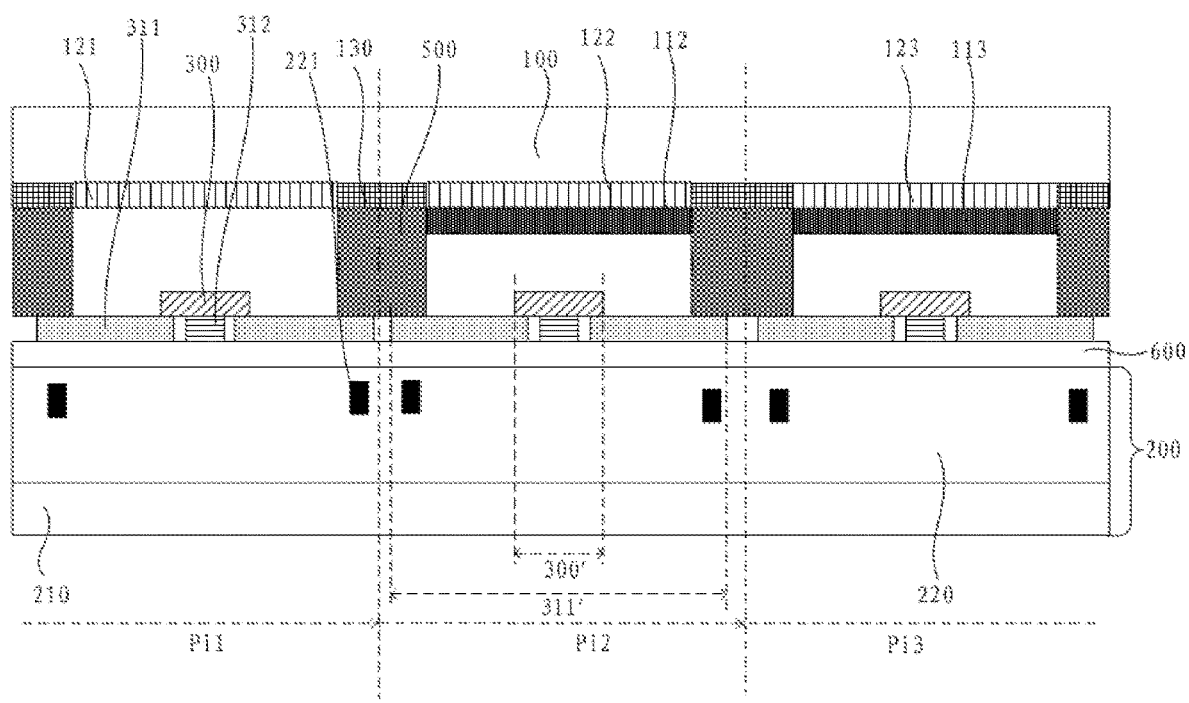
FIG. 21 is a schematic structural diagram of a display panel according to another embodiment of the present disclosure.

FIG. 21 is a schematic structural diagram of a display panel according to another embodiment of the present disclosure. As shown in FIG. 21, the connection electrode 310 includes a first sub-connection electrode 311 and a second sub-connection electrode 312. The light-emitting element 300 includes a first electrode terminal (not shown) connected to the first sub-connection electrode 311 and a second electrode terminal (not shown) connected to the second sub-connection electrode 312. In the pixel unit region Pi, the first sub-connection electrode 311 surrounds the second sub-connection electrode 312. A contour line 300' of the orthographic projection of the light-emitting element 300 on the base 210 is located inside a contour line 311' of an orthographic projection of the first sub-connection electrode 311 on the base 210. In this way, by increasing the area of the first sub-connection electrode 311, a capability of the first sub-connection electrodes 311 blocking the light reflected by the via hole 221 is improved, and a case that light generated by the light-emitting element 300 is transmitted through the first sub-connection electrode 311 into the via hole 221 can be prevented, to further improve the display effect of the display device.

As shown in FIG. 21, there is a gap between the barrier 500 and the second substrate 200, according to an embodiment of the present disclosure. The first sub-connection electrode 311 extends to the gap. In this way, the first sub-connection electrode 311 can prevent light emitted by adjacent light-emitting element 300 from entering other pixel unit regions Pi through the gap between the barrier 500 and the second substrate 200, to reduce the light crosstalk.

Figure 22:
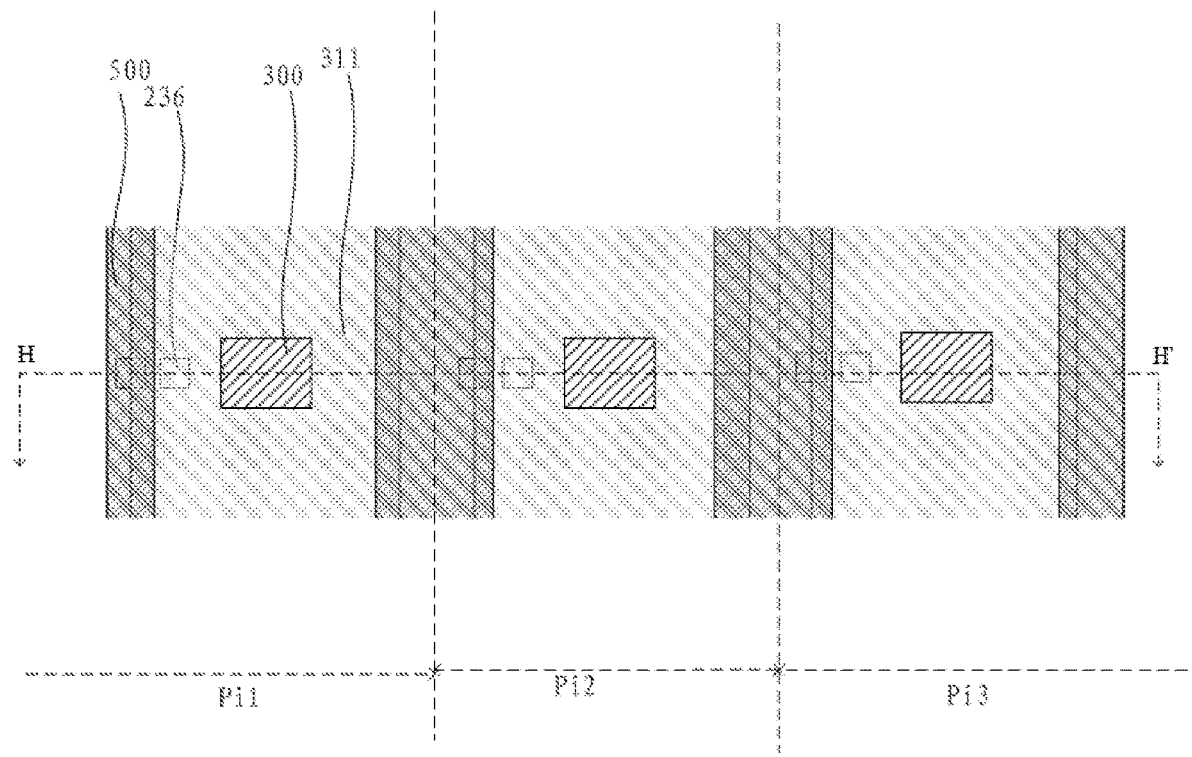
FIG. 22 is a schematic structural diagram of a display panel according to another embodiment of the present disclosure.
Figure 23:
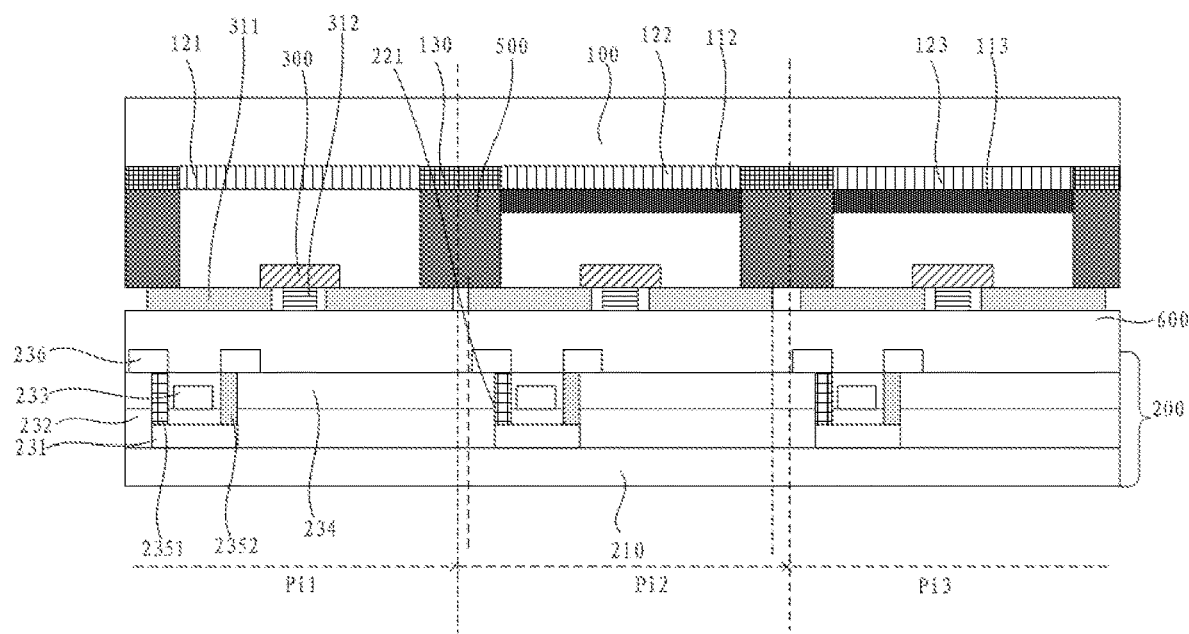
FIG. 23 is a section diagram of FIG. 22 in a HH' direction.

In an embodiment of the present disclosure, the via hole provided by the present disclosure may be a via hole of a transistor. That is, the driving circuit layer according to an embodiment of the present disclosure includes at least one transistor. The transistor includes the via hole. The via hole includes a via hole through which the source and drain of the transistor are respectively in contact with the active area thereof. FIG. 22 is a schematic structural diagram of a display panel according to another embodiment of the present disclosure, and FIG. 23 is a section diagram of FIG. 22 in a HH' direction. As shown in FIGS. 22 and 23, the driving circuit layer includes an active layer 231 on the base 210, where the active layer 231 includes an active area constituting a transistor; a gate insulating layer 232 located between the active layer 231 and the light-emitting element 300; a gate layer 233 located between the gate insulating layer 232 and the light-emitting element 300, where the gate layer 233 includes a gate included by a transistor; an interlayer insulating layer 234 located between the gate layer 233 and the light-emitting element 300; a first via hole 2351 and a second via hole 2352 located in a laminated construction formed by the interlayer insulating layer 234 and the gate insulating layer 232; a source-drain layer 236 located between the interlayer insulating layer 234 and the light-emitting element 300, where the source-drain layer 236 includes a source and a drain; and a first insulating layer 600 located between the source-drain layer 236 and the light-emitting element 300. The source is in contact with the active layer 231 through the first via hole 2351, the drain is in contact with the active layer through the second via hole 2352, and the via hole includes the first via hole 2351 and/or the second via hole 2352.

It should be noted that the via hole 221 according to the embodiments of the present disclosure is a structure formed by punching and metallizing an isolation structure between the wiring layers to connect different wiring layers. The via hole 221 can reflect light emitted by the light-emitting element 300, and the phenomenon of light crosstalk occurs between adjacent pixel unit regions Pi. In the transistor according to the embodiments of the present disclosure, the source and drain need to be in contact with the active area, and an insulating isolation structure is provided between the source and the active area and between the drain and the active area. Thus, the first via hole 2351 and the second via hole 2352 need to be provided to connect the electrodes and the active area. The via hole 221 provided in the embodiments of the present disclosure may include at least one of the first via hole 2351 and the second via hole 2352. Further, the light-shielding portion shields the first via hole 2351 and/or the second via hole 2352, to reduce the light crosstalk phenomenon between the adjacent pixel unit regions Pi.

In an embodiment, the transistor in the driving circuit layer 220 is connected to the light-emitting element 300 and is configured to provide a driving signal for the light-emitting element 300. The light-emitting element according to the embodiments of the present disclosure may be a micro light-emitting diode (Micro-LED).

It should be noted that the structures of the light-emitting element 300 and the transistors shown in FIG. 22 and FIG. 23 according to the embodiments of the present disclosure are merely used to illustrate related effect, which also include other connection structures. The position of the light-emitting element 300 in the pixel unit region Pi, the distribution of the transistors and the light-emitting element 300, etc., need to be subject to actual applications.

In an embodiment, a display device is provided according to an embodiment of the present disclosure. The display device includes the display panel provided in any one of the foregoing embodiments.

Figure 24:
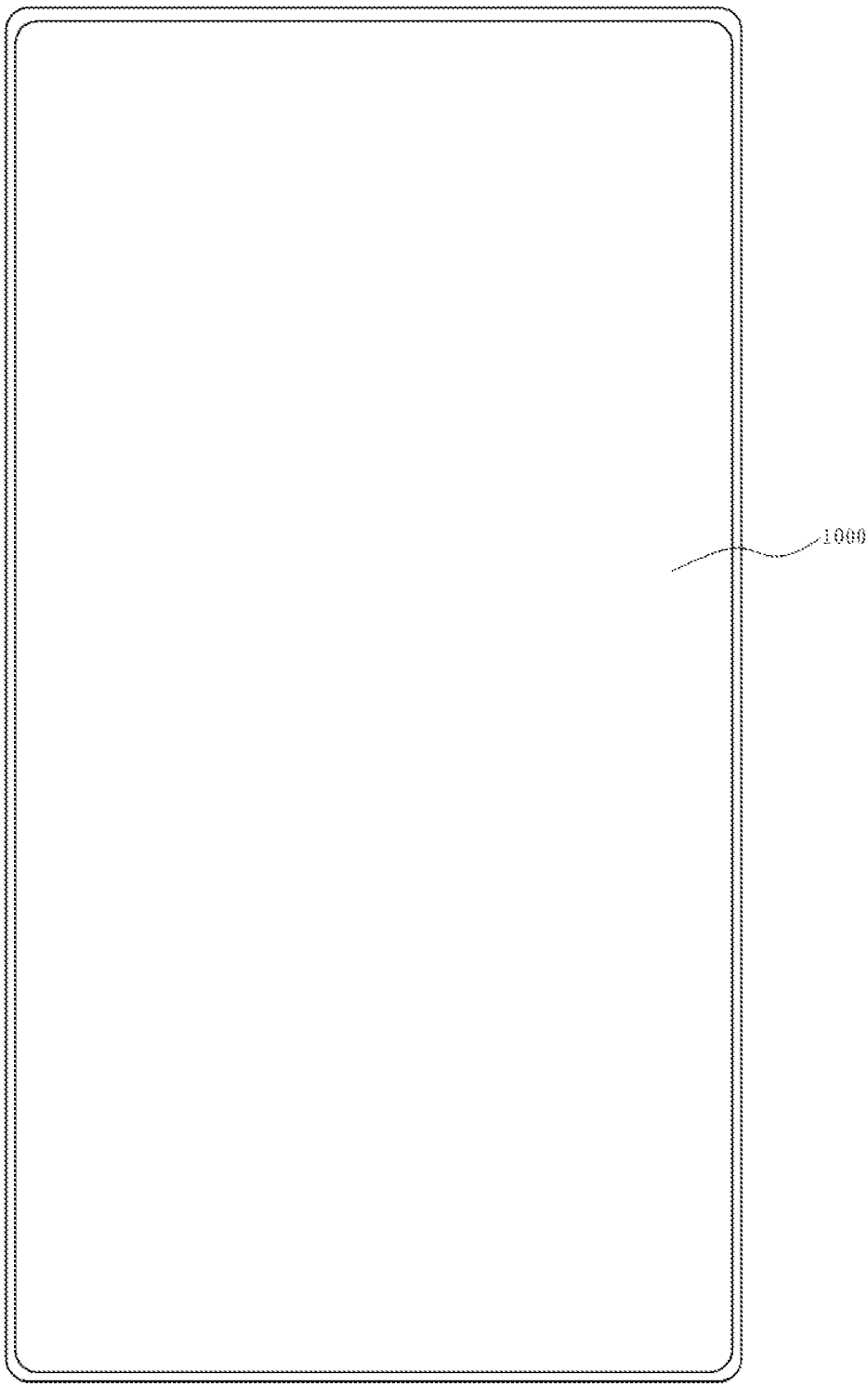
FIG. 24 is a schematic structural diagram of a display device according to an embodiment of the present disclosure.

FIG. 24 is a schematic structural diagram of a display device according to an embodiment of the present disclosure. Referring to FIG. 24, the display device 1000 according to the embodiment of the present disclosure may be a mobile terminal device.

In other embodiments of the present disclosure, the display device according to the present disclosure may also be an electronic display device such as a computer and a vehicle-mounted terminal, which is not specifically limited by the present disclosure.

A display panel and a display device are provided according to embodiments of the present disclosure. The display panel includes a first substrate, and a second substrate opposite to the first substrate. The display panel includes multiple pixel unit regions. In the pixel unit region, the second substrate includes a base, a light-emitting element located on a side of the base facing the first substrate, and a driving circuit layer between the light-emitting element and the base. The light-emitting element is used to generate first color light. The pixel unit region includes a first pixel unit region for generating the first color light, and the driving circuit layer includes multiple via holes. In the first pixel unit region, the display panel includes at least one first light-shielding portion on a side of the via hole away from the base. A first light-shielding orthographic projection of the first light-shielding portion on the base covers an orthographic projection of at least one via hole on the base.

In the embodiments of the present disclosure, in the first pixel unit region, the orthographic projection of the first light-shielding portion on the base covers the orthographic projection of at least one via hole on the base. Thus, the first light-shielding portion can shield light which is emitted by the adjacent light-emitting element and is reflected by the via hole. In addition, and the first light-shielding part can further shield the light which is emitted by the light-emitting element in the first pixel unit region to the via hole, to avoid reflecting the light to the adjacent pixel unit region by the via hole in the first pixel unit region. Therefore, the light crosstalk between adjacent light-emitting elements is reduced, and the display effect of the display device is improved.

What is claimed is:

1. A display panel, comprising:
   a first substrate; and
   a second substrate opposite to the first substrate;
   wherein the display panel comprises a plurality of pixel unit regions;
   wherein in at least one pixel unit region of the plurality of pixel unit regions, the second substrate comprises:
   a base;
   a light-emitting element located on a side of the base facing the first substrate; and
   a driving circuit layer located between the light-emitting element and the base,
   wherein the light-emitting element is configured to generate first color light, the plurality of pixel unit regions comprises a first pixel unit region configured to generate the first color light, and the driving circuit layer comprises a plurality of via holes; and
   wherein in the first pixel unit region, the display panel comprises at least one first light-shielding portion located on a side of the plurality of via holes away from the base, and a first light-shielding orthographic projection of the at least one first light-shielding portion on the base covers a via hole orthographic projection of at least one via hole of the plurality of via holes on the base.

2. The display panel according to claim 1, wherein the plurality of pixel unit regions comprises a second pixel unit region configured to generate second color light; and
   in the second pixel unit region, the display panel comprises at least one second light-shielding portion located on a side of the plurality of via holes away from the base, and a second light-shielding orthographic projection of the at least one second light-shielding portion on the base covers the via hole orthographic projection of the at least one via hole on the base.

3. The display panel according to claim 2, wherein
   the number of via hole orthographic projection covered by the first light-shielding orthographic projection in the first pixel unit region is greater than the number of via orthographic projection covered by the second light-shielding orthographic projection in the second pixel unit region; and/or
   the number of first light-shielding orthographic projection covering a same via hole orthographic projection in the first pixel unit region is greater than the number of second light-shielding orthographic projection covering a same via hole orthographic projection in the second pixel unit region.

4. The display panel according to claim 2, wherein at least one first light-shielding portion and at least one second light-shielding portion are a same first multiplexing light-shielding portion, and
   the number of via hole orthographic projection in the first pixel unit region covered by an orthographic projection of a first multiplexing light-shielding portion on the base is greater than the number of via hole orthographic projection in the second pixel unit region covered by the orthographic projection of the first multiplexing light-shielding portion on the base.

5. The display panel according to claim 2, wherein the plurality of pixel unit regions comprises a third pixel unit region configured to generate third color light; and
   in the third pixel unit region, the display panel comprises at least one third light-shielding portion located on a side of the plurality of via holes away from the base, and a third light-shielding orthographic projection of the at least one third light-shielding portion on the base covers the via hole orthographic projection of the at least one via hole on the base.

6. The display panel according to claim 5, wherein
   the number of via hole orthographic projection covered by the first light-shielding orthographic projection in the first pixel unit region is greater than the number of via hole orthographic projection covered by the third light-shielding orthographic projection in the third pixel unit region; and/or
   the number of first light-shielding orthographic projection covering a same via hole orthographic projection in the first pixel unit region is greater than the number of third light-shielding orthographic projections covering a same via hole orthographic projection in the third pixel unit region.

7. The display panel according to claim 5, wherein light-emitting conversion efficiency of the light-emitting element in the second pixel unit region is lower than light-emitting conversion efficiency of the light-emitting element in the third pixel unit region, wherein
   the number of via hole orthographic projection covered by the third light-shielding orthographic projection in the third pixel unit region is greater than the number of via hole orthographic projection covered by the second light-shielding orthographic projection in the second pixel unit region; and/or
   the number of third light-shielding orthographic projection covering a same via hole orthographic projection in the third pixel unit region is greater than the number of second light-shielding orthographic projections covering a same via hole orthographic projection in the second pixel unit region.

8. The display panel according to claim 5, wherein
   at least one first light-shielding portion and at least one third light-shielding portion are a same second multiplexing light-shielding portion, and the number of via hole orthographic projection in the first pixel unit region covered by a orthographic projection of a second multiplexing light-shielding portion on the base is greater than the number of via hole orthographic projection in the third pixel unit region covered by the orthographic projection of the second multiplexing light-shielding portion on the base.

9. The display panel according to claim 5, wherein
   at least one second light-shielding portion and at least one third light-shielding portion are a same third multiplexing light-shielding portion, and the number of via hole orthographic projection in the second pixel unit region covered by an orthographic projection of a third multiplexing light-shielding portion on the base is less than the number of via hole orthographic projection in the third pixel unit region covered by the orthographic projection of the third multiplexing light-shielding portion on the base.

10. The display panel according to claim 5, wherein the first color light is blue light, the second color light is red light, and the third color light is green light;
   wherein in the first pixel unit region, the first substrate comprises a first color resist layer;
   in the second pixel unit region, the first substrate comprises a second quantum dot conversion layer and a second color resist, wherein the second color resist is located on a side of the second quantum dot conversion layer away from the light-emitting element; and
   wherein in the third pixel unit region, the first substrate comprises a third quantum dot conversion layer and a third color resist, wherein the third color resist is located on a side of the third quantum dot conversion layer away from the light-emitting element.

11. The display panel according to claim 1, wherein in the at least one pixel unit region, the first substrate comprises a black matrix layer, wherein the black matrix layer comprises a light-transmitting area corresponding to the light-emitting element; the display panel comprises a barrier located between the first substrate and the second substrate and surrounding the light-emitting element; the second substrate comprises a first insulating layer located between the driving circuit layer and the light-emitting element, and a connection electrode located between the first insulating layer and the light-emitting element; and
   a light-shielding portion having an orthographic projection on the base covering the via hole orthographic projection includes the black matrix layer, the barrier, the connection electrode, or the light-emitting element.

12. The display panel according to claim 11, wherein the barrier is located on the first substrate, and is located on a side of the black matrix layer facing the second substrate.

13. The display panel according to claim 11, wherein in the at least one pixel unit region, the light-shielding portion comprises the connection electrode and the barrier, an orthographic projection of the connection electrode on the base has a first overlapping region with an orthographic projection of the barrier on the base; and
   wherein at least one via hole orthographic projection is located in the first overlapping region.

14. The display panel according to claim 11, wherein in the at least one pixel unit region, the light-shielding portion comprises the connection electrode and the black matrix layer, an orthographic projection of the connection electrode on the base has a second overlapping region with an orthographic projection of the black matrix layer on the base; and
   wherein at least one via hole orthographic projection is located in the second overlapping region.

15. The display panel according to claim 11, wherein in the at least one pixel unit region, the light-shielding portion comprises the connection electrode, the black matrix layer and the barrier, an orthographic projection of the connection electrode on the base has a third overlapping region with an orthographic projection of the black matrix layer on the base and an orthographic projection of the barrier on the base; and
   wherein at least one via hole orthographic projection is located in the third overlapping region.

16. The display panel according to claim 11, wherein the connection electrode comprises a first sub-connection electrode and a second sub-connection electrode, and the light-emitting element comprises a first electrode terminal connected to the first sub-connection electrode and a second electrode terminal connected to the second sub-connection electrode; and
   wherein in the at least one pixel unit region, the first sub-connection electrode surrounds the second sub-connection electrode, and a contour line of an orthographic projection of the light-emitting element on the base is located inside a contour line of an orthographic projection of the first sub-connection electrode on the base.

17. The display panel according to claim 16, wherein a gap is provided between the barrier and the second substrate, and the first sub-connection electrode extends to the gap.

18. The display panel according to claim 1, wherein the driving circuit layer comprises at least one transistor, and the at least one transistor comprises at least one via hole of the plurality of via holes.

19. The display panel according to claim 18, wherein the driving circuit layer comprises:
   an active layer;
   a gate insulating layer located between the active layer and the light-emitting element;
   a gate layer located between the gate insulating layer and the light-emitting element, wherein the gate layer comprises a gate;
   an interlayer insulating layer located between the gate layer and the light-emitting element;
   a first via hole and a second via hole, wherein the first via and the second via are located in a laminated construction formed by the interlayer insulating layer and the gate insulating layer; and
   a source-drain layer located between the interlayer insulating layer and the light-emitting element, wherein the source-drain layer comprises a source and a drain;
   wherein the source is in contact with the active layer through the first via hole, the drain is in contact with the active layer through the second via hole, and the at least one via hole comprises at least one of the first via hole and the second via hole.

20. A display device, wherein the display device comprises a display panel, and the display panel comprise:
   a first substrate; and
   a second substrate opposite to the first substrate;
   wherein the display panel comprises a plurality of pixel unit regions;
   wherein in at least one pixel unit region of the plurality of pixel unit regions, the second substrate comprises:
      a base;
      a light-emitting element located on a side of the base facing the first substrate; and
      a driving circuit layer located between the light-emitting element and the base,
      wherein the light-emitting element is configured to generate first color light, the plurality of pixel unit regions comprises a first pixel unit region configured to generate the first color light, and the driving circuit layer comprises a plurality of via holes; and
      wherein in the first pixel unit region, the display panel comprises at least one first light-shielding portion located on a side of the plurality of via holes away from the base, and a first light-shielding orthographic projection of the at least one first light-shielding portion on the base covers a via hole orthographic projection of at least one via hole of the plurality of via holes on the base.

* * * * *